(12) United States Patent
Kim et al.

(10) Patent No.: US 9,972,544 B2
(45) Date of Patent: May 15, 2018

(54) SEMICONDUCTOR DEVICE WITH CONDUCTIVE PATTERN ON INSULATING LINE PATTERN ON SPACER ON FIELD INSULATING FILM IN TRENCH BETWEEN FIN PATTERNS

(71) Applicant: SAMSUNG ELECTRONICS CO., LTD., Suwon-si, Gyeonggi-do (KR)

(72) Inventors: Ju Youn Kim, Suwon-si (KR); Ji Hwan An, Seoul (KR); Tae Won Ha, Seongnam-si (KR); Se Ki Hong, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days. days.

(21) Appl. No.: 15/390,762

(22) Filed: Dec. 27, 2016

(65) Prior Publication Data

US 2017/0213771 A1    Jul. 27, 2017

(30) Foreign Application Priority Data

Jan. 21, 2016   (KR) .................. 10-2016-0007450

(51) Int. Cl.
*H01L 21/82* (2006.01)
*H01L 29/06* (2006.01)
(Continued)

(52) U.S. Cl.
CPC ............. *H01L 21/823878* (2013.01); *H01L 21/823431* (2013.01); *H01L 21/823481* (2013.01); *H01L 21/823814* (2013.01); *H01L 21/823821* (2013.01); *H01L 27/0886* (2013.01); *H01L 27/0924* (2013.01); *H01L 29/0653* (2013.01); *H01L 29/0847* (2013.01); *H01L 29/161* (2013.01); *H01L 29/165* (2013.01);
(Continued)

(58) Field of Classification Search
CPC .............. H01L 21/823; H01L 29/0653; H01L 29/0847; H01L 27/0886; H01L 27/0924
See application file for complete search history.

(56) References Cited

U.S. PATENT DOCUMENTS 7,413,943 B2   8/2008 Kim et al.
8,836,046 B2   9/2014 Maeda et al.
(Continued)

FOREIGN PATENT DOCUMENTS

KR        10-0609525 B1     8/2006

*Primary Examiner* — Thanh V Pham
(74) *Attorney, Agent, or Firm* — Lee & Morse, P.C.

(57) ABSTRACT

A semiconductor device including a first fin pattern and a second fin pattern, which are in parallel in a lengthwise direction; a first trench between the first fin pattern and the second fin pattern; a field insulating film partially filling the first trench, an upper surface of the field insulating film being lower than an upper surface of the first fin pattern and an upper surface of the second fin pattern; a spacer spaced apart from the first fin pattern and the second fin pattern, the spacer being on the field insulating film and defining a second trench, the second trench including an upper portion and an lower portion; an insulating line pattern on a sidewall of the lower portion of the second trench; and a conductive pattern filling an upper portion of the second trench and being on the insulating line pattern.

20 Claims, 24 Drawing Sheets

(51) Int. Cl.
*H01L 27/088* (2006.01)
*H01L 21/8238* (2006.01)
*H01L 27/092* (2006.01)
*H01L 29/66* (2006.01)
*H01L 29/08* (2006.01)
*H01L 29/161* (2006.01)
*H01L 29/16* (2006.01)
*H01L 29/165* (2006.01)
*H01L 29/78* (2006.01)
*H01L 21/8234* (2006.01)

(52) U.S. Cl.
CPC .... *H01L 29/1608* (2013.01); *H01L 29/66545* (2013.01); *H01L 29/7848* (2013.01)

(56) References Cited

U.S. PATENT DOCUMENTS

| | | |
|---|---|---|
| 8,916,460 B1 | 12/2014 | Kwon et al. |
| 9,117,910 B2 | 8/2015 | Jeong et al. |
| 9,564,369 B1 | 2/2017 | Kim et al. |
| 2007/0134884 A1 | 6/2007 | Kim et al. |
| 2014/0353763 A1 | 12/2014 | Chung et al. |
| 2015/0147860 A1* | 5/2015 | Kim .................. H01L 29/66795 438/283 |
| 2015/0214341 A1 | 7/2015 | Shin et al. |
| 2015/0279995 A1 | 10/2015 | Maeda et al. |
| 2016/0049511 A1* | 2/2016 | Kim .................. H01L 29/7848 257/401 |

* cited by examiner

SEMICONDUCTOR DEVICE WITH CONDUCTIVE PATTERN ON INSULATING LINE PATTERN ON SPACER ON FIELD INSULATING FILM IN TRENCH BETWEEN FIN PATTERNS

CROSS-REFERENCE TO RELATED APPLICATION

Korean Patent Application No. 10-2016-0007450, filed on Jan. 21, 2016, in the Korean Intellectual Property Office, and entitled: "Semiconductor Device and Method for Fabricating the Same," is incorporated by reference herein in its entirety.

BACKGROUND

1. Field

Embodiments relate to a semiconductor device and a method for fabricating the same.

2. Description of the Related Art

For semiconductor device density enhancement, the multigate transistor has been suggested as one of the scaling technologies, according to which a multi-channel active pattern (or silicon body) in a fin or nanowire shape is formed on a substrate, with gates then being formed on a surface of the multi-channel active pattern.

Such a multigate transistor allows easy scaling as it uses a three-dimensional channel. Further, current control capability can be enhanced without requiring increased gate length of the multigate transistor. Furthermore, it is possible to effectively suppress short channel effect (SCE) which is the phenomenon that the electric potential of the channel region is influenced by the drain voltage.

SUMMARY

The embodiments may be realized by providing a semiconductor device including a first fin pattern and a second fin pattern, which are in parallel in a lengthwise direction; a first trench between the first fin pattern and the second fin pattern; a field insulating film partially filling the first trench, an upper surface of the field insulating film being lower than an upper surface of the first fin pattern and an upper surface of the second fin pattern; a spacer spaced apart from the first fin pattern and the second fin pattern, the spacer being on the field insulating film and defining a second trench, the second trench including an upper portion and an lower portion; an insulating line pattern on a sidewall of the lower portion of the second trench; and a conductive pattern filling an upper portion of the second trench and being on the insulating line pattern.

The embodiments may be realized by providing a semiconductor device including a first fin pattern having a long side and a short side; a field insulating film on a sidewall of the first fin pattern, an upper surface of the field insulating film being lower than an upper surface of the first fin pattern; a spacer on the field insulating film, the spacer being spaced apart from the first fin pattern and defining a trench; an insulating line pattern extending along a portion of a sidewall of the trench, on the spacer, an uppermost portion of the insulating line pattern being equal to or higher than the upper surface of the first fin pattern; and a conductive pattern filling the trench on the insulating line pattern.

The embodiments may be realized by providing a semiconductor device including a laterally adjacent first fin pattern and second fin pattern on a substrate; a first trench between the laterally adjacent first fin pattern and second fin pattern; a field insulating film partially filling the first trench such that field insulating film is on a sidewall of the first fin pattern and a sidewall of the second fin pattern, a distance between an upper surface of the field insulating film and the substrate being smaller than a distance between an upper surface of the first fin pattern and the substrate and a distance between an upper surface of the second fin pattern and the substrate; a spacer completely spaced apart from the first fin pattern and the second fin pattern, the spacer being on the field insulating film and defining a second trench such that the second trench includes an upper portion and an lower portion; an insulating line pattern on a sidewall of the lower portion of the second trench; and a conductive pattern filling an upper portion of the second trench and being on the insulating line pattern.

BRIEF DESCRIPTION OF THE DRAWINGS

Features will be apparent to those of skill in the art by describing in detail exemplary embodiments with reference to the attached drawings in which.

DETAILED DESCRIPTION

Hereinbelow, a semiconductor device according to a first exemplary embodiment will be explained with reference to FIGS. 1 to 5B.

Figure 1:
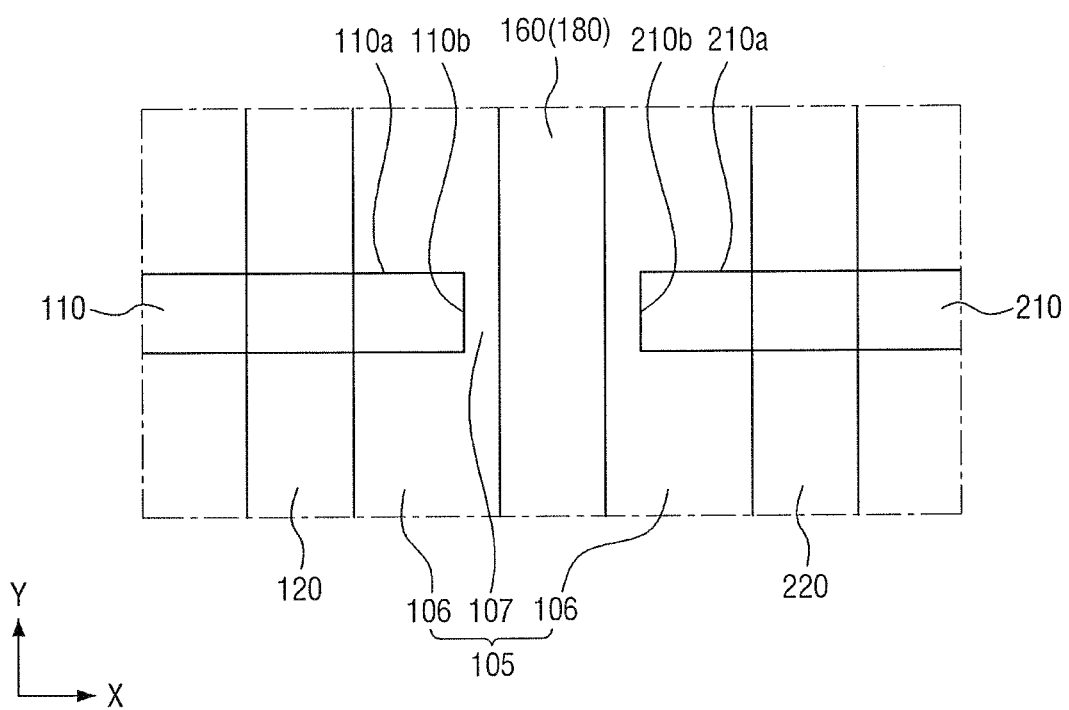
FIGS. 1 and 2 illustrate a layout diagram and a perspective view of a semiconductor device according to some exemplary embodiments.
Figure 2:
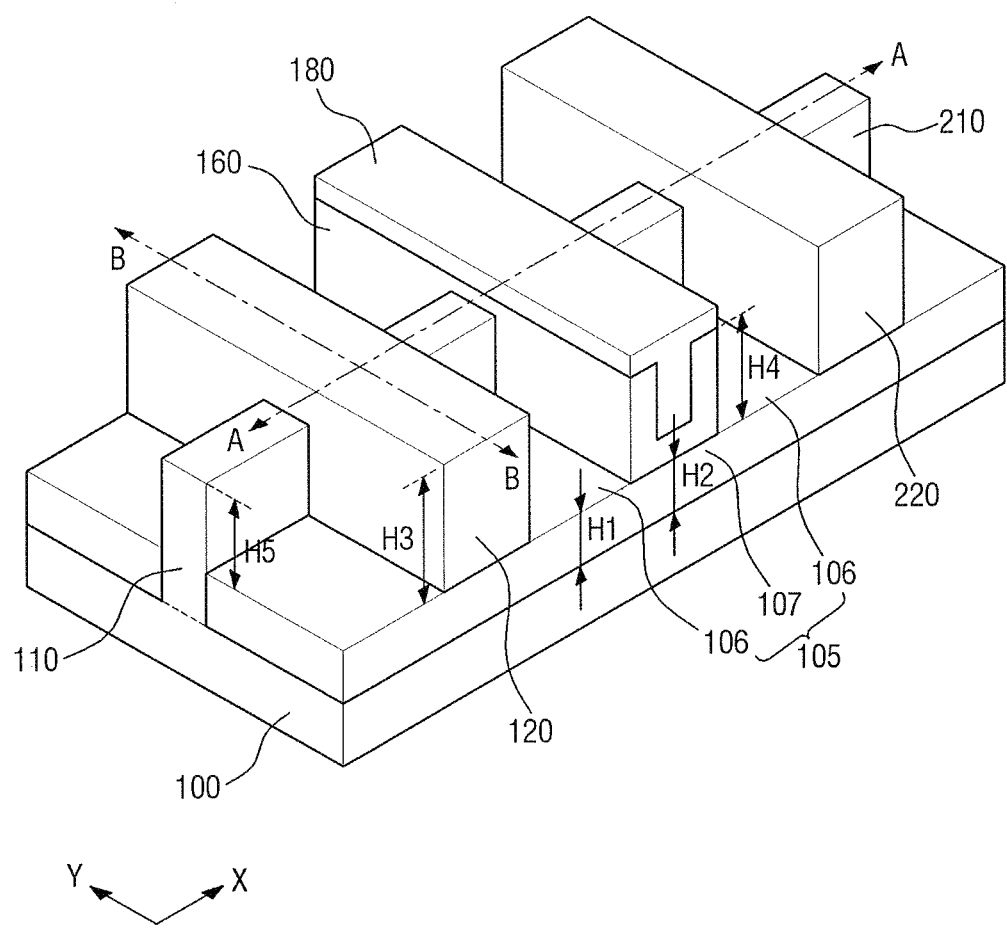
Figure 3:
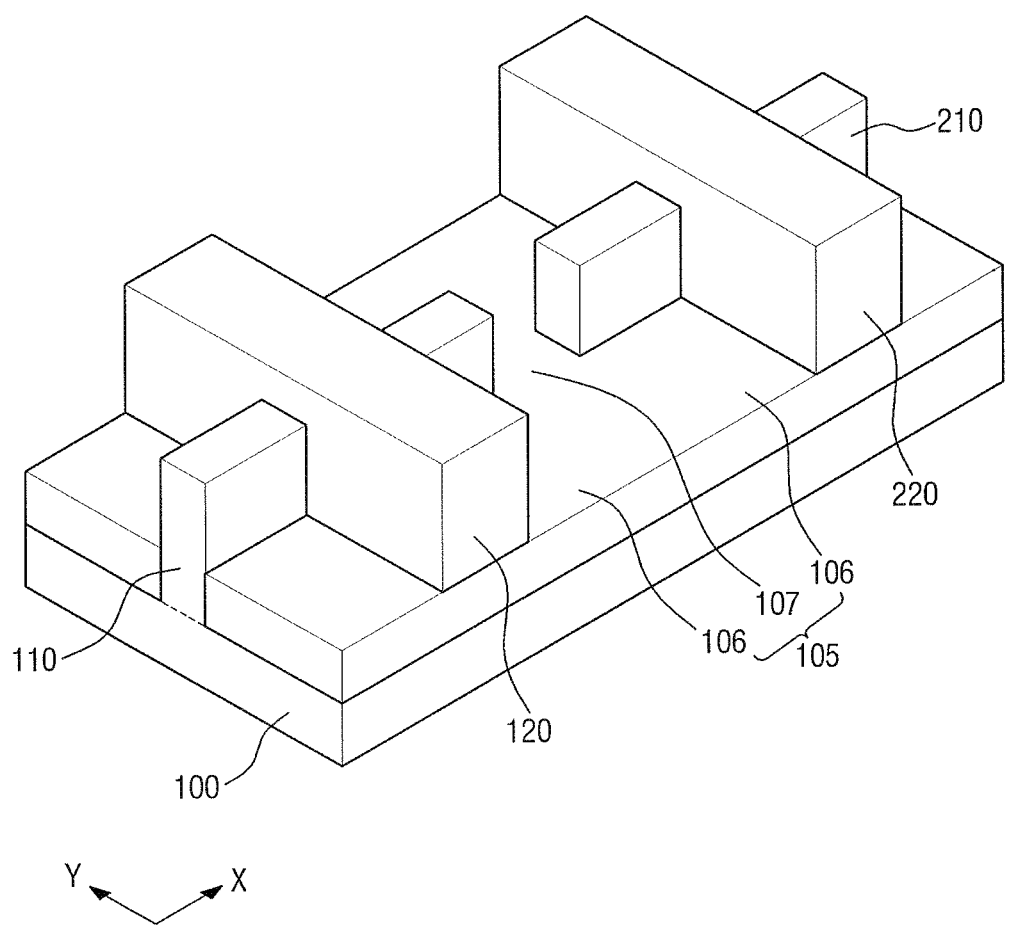
FIG. 3 illustrates a partial perspective view of the fin-type pattern and the field insulating film of FIG. 2.
Figure 4A:
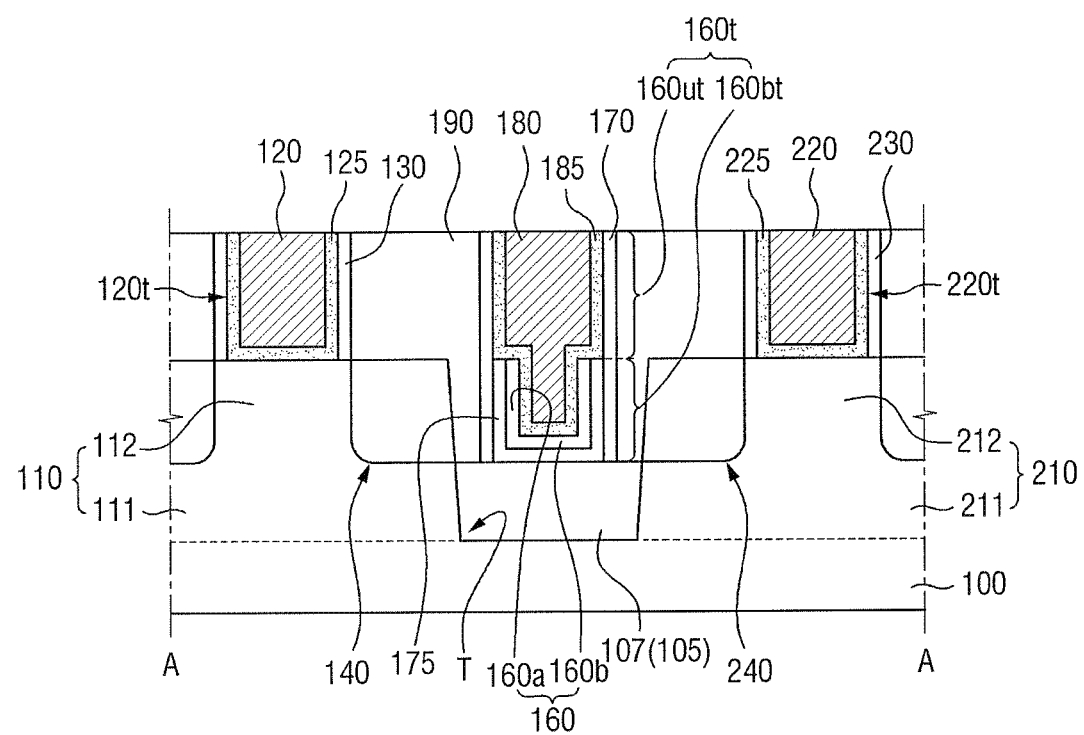
FIGS. 4A and 4B illustrate cross sectional views taken on line A-A of FIG. 2.
Figure 4B:
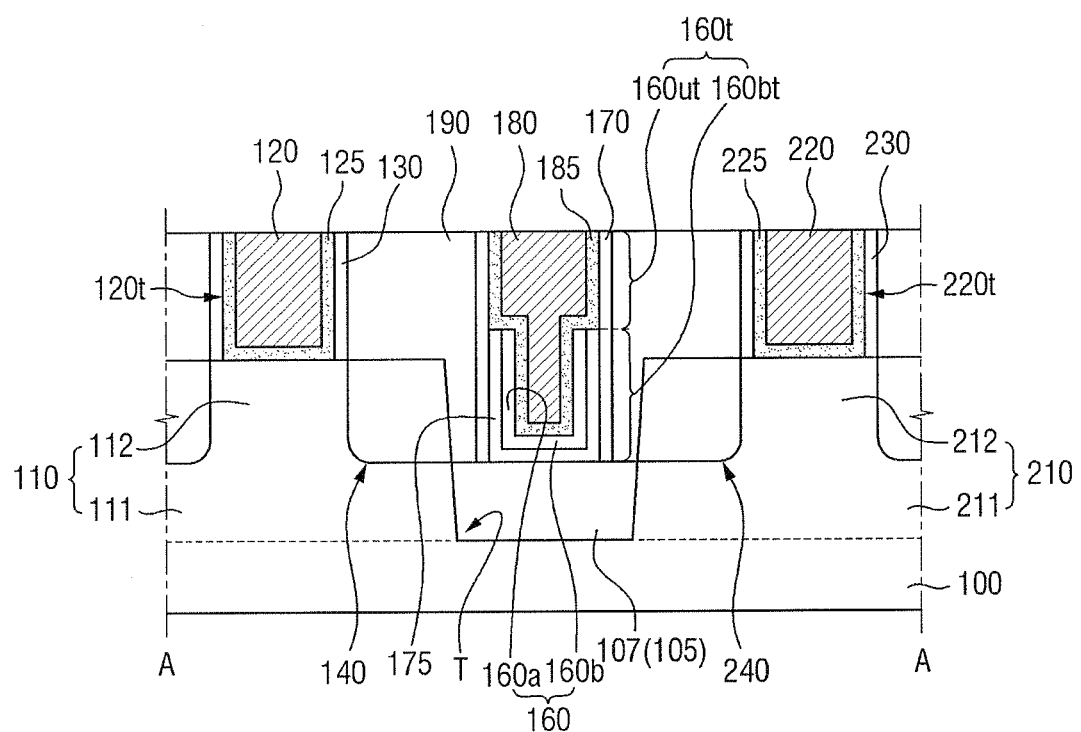
Figure 5A:
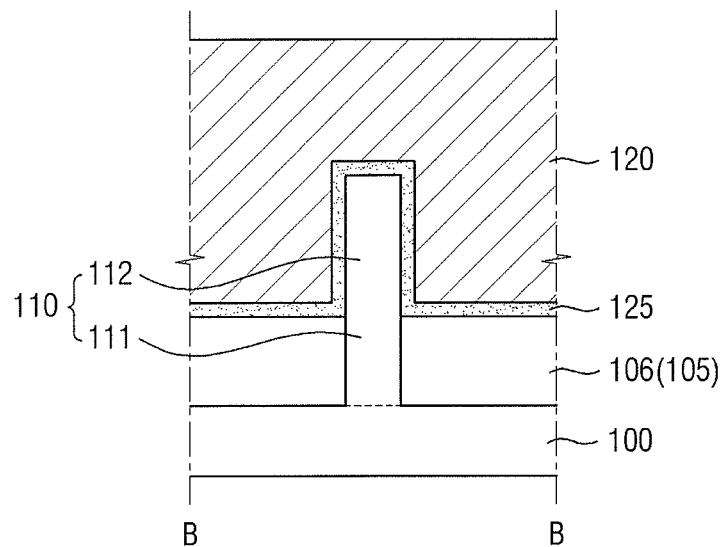
FIGS. 5A and 5B illustrate cross sectional views taken on line B-B of FIG. 2.
Figure 5B:
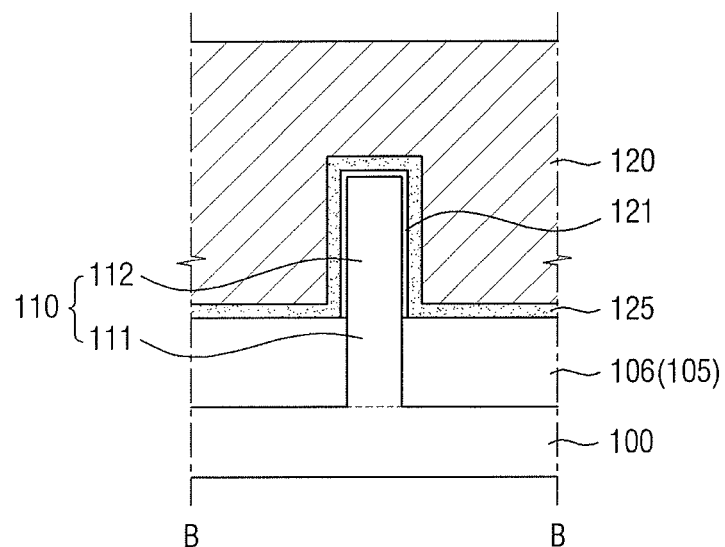

FIGS. 1 and 2 illustrate a layout diagram and a perspective view of a semiconductor device according to some exemplary embodiments. FIG. 3 illustrates a partial perspective view of the fin-type pattern and the field insulating film of FIG. 2. FIGS. 4A and 4B illustrate cross sectional views taken on line A-A of FIG. 2. FIGS. 5A and 5B illustrate cross sectional views taken on line B-B of FIG. 2.

For reference, the fin-type patterns illustrated in FIGS. 1 to 3 include source/drains formed on the fin-type (e.g., fin) patterns or in the fin-type patterns. Further, FIG. 2 briefly illustrates a fin-type pattern, a gate electrode, a conductive pattern, an insulating line pattern, and so on.

The drawings regarding a semiconductor device according to some exemplary embodiments exemplify a fin-type transistor (FinFET) including a channel region in a fin-type pattern shape. In an implementation, a semiconductor device according to some exemplary embodiments may include a tunneling field-effect transistor (FET), a transistor comprising nanowire, a transistor including nano-sheet, or a three-dimensional (3D) transistor. In an implementation, a semiconductor device according to some exemplary embodiments may include a bipolar junction transistor, a laterally diffused metal oxide semiconductor (LDMOS) transistor, and so on.

Referring to FIGS. 1 to 5B, a semiconductor device according to some exemplary embodiments may include a first fin-type pattern (e.g., fin pattern) 110, a second fin-type pattern 210, a first gate electrode 120, a second gate electrode 220, an insulating line pattern 160, and a conductive pattern 180.

A substrate 100 may be, e.g., a bulk silicon or a silicon-on-insulator (SOI). In an implementation, the substrate 100 may be a silicon substrate, or may include other material, e.g., silicon germanium, silicon germanium on insulator (SGOI), indium antimonide, lead telluride, indium arsenide, indium phosphide, gallium arsenide, or gallium antimonide.

The first fin-type pattern 110 and the second fin-type pattern 210 may be elongated or may extend in a first direction X. The first fin-type pattern 110 and the second fin-type pattern 210 may be formed in parallel in a lengthwise direction.

The first fin-type pattern 110 and the second fin-type pattern 210 may extend in the first direction X, and the first fin-type pattern 110 and the second fin-type pattern 210 may each include long sides 110a and 210a along the first direction X, and short sides 110b and 210b along a second direction Y.

For example, when the first fin-type pattern 110 and the second fin-type pattern 210 are formed in parallel in the lengthwise direction, it means that the short side 110b of the first fin-type active pattern 110 is facing the short side 210b of the second fin-type pattern 210.

The long sides and the short sides may be distinguishable even when the first fin-type pattern 110 and the second fin-type pattern 210 have rounded corners.

The first fin-type pattern 110 and the second fin-type pattern 210 may be adjacent to each other. The first fin-type pattern 110 and the second fin-type pattern 210 in parallel in the lengthwise direction may be isolated by an isolating trench T.

The isolating trench T may be between the first fin-type pattern 110 and the second fin-type pattern 210. For example, the isolating trench T may be formed so as to be in contact with the short side 110b of the first fin-type pattern 110 and the short side 210b of the second fin-type pattern 210. For example, the short side 110b of the first fin-type pattern 110 and the short side 210b of the second fin-type pattern 210 may be defined by at least a portion of the isolating trench T.

The first fin-type pattern 110 and the second fin-type pattern 210 may refer to active patterns for use in the multigate transistor. Accordingly, the first fin-type pattern 110 and the second fin-type pattern 210 may be formed as the channels are connected with each other along three surfaces of the fin, or alternatively, the channels may be formed on two facing surfaces of the fin.

In the semiconductor device according to some exemplary embodiments, the first fin-type pattern 110 and the second fin-type pattern 210 may so located as to be interposed by the isolating trench T therebetween.

In an implementation, the first fin-type pattern 110 may be formed on one side of the isolating trench T, and the second fin-type pattern 210 may not be located on the other of the isolating trench T.

Hereinbelow, however, it is described that the first fin-type pattern 110 and the second fin-type pattern 210 are located on both sides of the isolating trench T.

The first fin-type pattern 110 and the second fin-type pattern 210 may be a portion of the substrate 100, and may include an epitaxial layer grown on the substrate 100.

The first fin-type pattern 110 and the second fin-type pattern 210 may include an element semiconductor material, e.g., silicon or germanium. In an implementation, the first fin-type pattern 110 and the second fin-type pattern 210 may include a compound semiconductor, e.g., a IV-IV group compound semiconductor or a III-V group compound semiconductor.

For example, with respect to the IV-IV group compound semiconductor, the first fin-type pattern 110 and the second fin-type pattern 210 may be a binary compound or a ternary compound including at least two or more of carbon (C), silicon (Si), germanium (Ge) and tin (Sn), or these compounds doped with IV group element.

With respect to the III-V group compound semiconductor, the first fin-type pattern 110 and the second fin-type pattern 210 may be one of a binary compound, a ternary compound or a quaternary compound which is formed by a combination of a III group element which may be at least one of aluminum (Al), gallium (Ga), or indium (In), with a V group element which may be one of phosphorus (P), arsenic (As) and antimony (Sb).

In an implementation, in the semiconductor device, the first fin-type pattern 110 and the second fin-type pattern 210 may be silicon fin-type patterns.

A field insulating film 105 may be formed on the substrate 100. The field insulating film 105 may be formed around the first fin-type pattern 110 and the second fin-type pattern 210. As such, the first fin-type pattern 110 and the second fin-type pattern 210 may be defined by the field insulating film 105.

For example, the field insulating film 105 may be formed on a portion of a sidewall of the first fin-type pattern 110 and on a portion of a sidewall of the second fin-type pattern 210.

The field insulating film 105 may include a first region 106 and a second region 107.

The first region 106 of the field insulating film may cover a sidewall including the long side 110a of the first fin-type pattern 110 and a sidewall including the long side 210a of the second fin-type pattern 210. The first region 106 of the field insulating film may be elongated or extend in the first direction X, along the long side 110a of the first fin-type pattern 110 and the long side 210a of the second fin-type pattern 210.

The second region 107 of the field insulating film may cover a sidewall including the short side 110b of the first fin-type pattern 110 and a sidewall including the short side 210b of the second fin-type pattern 210. The second region 107 of the field insulating film may be between the short side 110b of the first fin-type pattern 110 and the short side 210b of the second fin-type pattern 210.

The second region 107 of the field insulating film may partially fill the isolating trench T between the first fin-type pattern 110 and the second fin-type pattern 210.

An upper surface of the field insulating film 105 may be lower than an upper surface of the first fin-type pattern 110 and an upper surface of the second fin-type pattern 210. For example, an upper surface of the first region 106 of the field insulating film and an upper surface of the second region 107 of the field insulating film may be lower than the upper surface of the first fin-type pattern 110 and the upper surface of the second fin-type pattern 210, respectively. For example, an upper surface of the above-described elements may refer to a surface that faces away from the substrate 100.

For example, with reference to a bottom of the isolating trench T, a height H1 of the first region 106 of the field insulating film and a height H2 of the second region 107 of the field insulating film may be less than the height of the first fin-type pattern 110 and the height of the second fin-type pattern 210 (e.g., also with respect to the bottom of the isolating trench T), respectively.

The field insulating film 105 may partially cover the first fin-type pattern 110 and the second fin-type pattern 210. The first fin-type pattern 110 may include a lower portion 111 and an upper portion 112, and the second fin-type pattern 210 may include a lower portion 211 and an upper portion 212.

The field insulating film 105 may cover the lower portion 111 of the first fin-type pattern and the lower portion 211 of the second fin-type pattern. In an implementation, the field insulating film 105 may not cover the upper portion 112 of the first fin-type pattern nor the upper portion 212 of the second fin-type pattern. For example, the field insulating film 105 may not be in contact with, nor may it be overlapped or laterally aligned with the upper portion 112 of the first fin-type pattern and the upper portion 212 of the second fin-type pattern.

For example, the upper portion 112 of the first fin-type pattern and the upper portion 212 of the second fin-type pattern may protrude upwardly further than or outwardly relative to the upper surface of the first region 106 of the field insulating film and the upper surface of the second region 107 of the field insulating film 105, respectively.

The field insulating film 105 may include, e.g., an oxide film, a nitride film, an oxynitride film, or a film combining the above.

A first spacer 130 may extend in the second direction Y and may intersect the first fin-type pattern 110. The first spacer 130 may define a first trench 120t.

The first trench 120t may extend in the second direction Y and may intersect the first fin-type pattern 110. The first trench 120t may expose a portion of the first fin-type pattern 110.

A second spacer 230 may extend in the second direction Y and may intersect the second fin-type pattern 210. The second spacer 230 may define a second trench 220t.

The second trench 220t may extend in the second direction Y and may intersect the second fin-type pattern 110. The second trench 220t may expose a portion of the second fin-type pattern 210.

The first liner 170 may extend in the second direction Y and may span between the first fin-type pattern 110 and the second fin-type pattern 210. The first liner 170 may be formed on the second region 107 of the field insulating film 105. The first liner 170 may be spaced apart from, e.g., and not be in contact with, the first fin-type pattern 110 and the second fin-type pattern 210.

The first liner 170 may define a third trench 160t. The third trench 160t may extend in the second direction Y, between the first trench 120t and the second trench 220t. The third trench 160t may be formed between the first fin-type pattern 110 and the second fin-type pattern 210. The third trench 160t may expose the upper surface of the second region 107 of the field insulating film.

The third trench 160t may span between the short side 110b of the first fin-type pattern 110 and the short side 210b of the second fin-type pattern 210. The third trench 160t may be in parallel with the short side 110b of the first fin-type pattern 110 and the short side 210b of the second fin-type pattern 210, respectively.

The third trench 160t may include an upper portion 160ut and a lower portion 160bt. The manner in which the upper portion 160ut of the third trench and the lower portion 160bt of the third trench are distinguished from each other will be explained below, when explaining the insulating line pattern 160 and the conductive pattern 180.

In the semiconductor device according to some exemplary embodiments, the upper portion 160ut of the third trench and the lower portion 160bt of the third trench may have substantially the same width as each other, at an area near a boundary between the upper portion 160ut of the third trench and the lower portion 160bt of the third trench. For example, a sidewall of the upper portion 160ut of the third trench and a sidewall of the lower portion 161bt of the third trench may be in the same plane.

The first liner 170 may be in contact with the upper surface of the second region 107 of the field insulating film. A height of the first liner 170 may be substantially the same as the thickness of an interlayer insulating film 190 covering the second region 107 of the field insulating film.

The first spacer 130, the second spacer 230, and the first liner 170 may each include at least one of, e.g., silicon nitride (SiN), silicon oxynitride (SiON), silicon dioxide ($SiO_2$), oxycarbonitride (SiOCN), or a combination thereof.

The interlayer insulating film 190 may be formed on the field insulating film 105. The interlayer insulating film 190 may cover the first fin-type pattern 110, the second fin-type pattern 210, and the field insulating film 105.

The interlayer insulating film 190 may surround an outer sidewall of the first spacer 130 defining the first trench 120t, an outer sidewall of the second spacer 230 defining the second trench 220t, and an outer sidewall of the first liner 170 defined the third trench 160t.

The interlayer insulating film 190 may include, e.g., at least one of silicon oxide, silicon nitride, silicon oxynitride, and a low-k dielectric material. For example, the low-k dielectric material may include flowable oxide (FOX), Tonen Silazene (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SILK, polyimide, porous polymeric material, or a combination thereof.

The first gate electrode 120 may be formed so as to extend in the second direction Y and intersect the first fin-type pattern 110. The first gate electrode 120 may be formed in the first trench 120*t*.

The first gate electrode 120 may be formed on the first fin-type pattern 110 and the field insulating film 105. The first gate electrode 120 may surround the first fin-type pattern 110 protruding upwardly further than the upper surface of the field insulating film 105, e.g., may surround the upper portion 112 of the first fin-type pattern.

The second gate electrode 220 may be formed so as to extend in the second direction Y and may intersect the second fin-type pattern 210. The second gate electrode 220 may be formed in the second trench 220*t*.

The second gate electrode 220 may be formed on the second fin-type pattern 210 and the field insulating film 105. The second gate electrode 220 may surround the second fin-type pattern 210 protruding upwardly further than the upper surface of the field insulating film 105, e.g., may surround the upper portion 212 of the second fin-type pattern.

The first gate electrode 120 and the second gate electrode 220 may each include at least one of, e.g., titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or a combination thereof.

The first gate electrode 120 and the second gate electrode 220 may each include, e.g., a conductive metal oxide, a conductive metal oxynitride, or the like, and an oxidized form of the materials described above.

For example, the first gate electrode 120 and the second gate electrode 220 may be formed by replacement process (or gate last process).

The insulating line pattern 160 may be formed on the second region 107 of the field insulating film. The insulating line pattern 160 may extend in the second direction Y.

The insulating line pattern 160 may be formed on the first liner 170, e.g., on the sidewall of the first liner 170. The insulating line pattern 160 may be formed in a portion of the third trench 106*t* that exposes the upper surface of the second region 107 of the field insulating film.

In an implementation, the insulating line pattern 160 may be formed on the sidewall and a bottom surface of the lower portion 160*bt* of the third trench.

The insulating line pattern 160 may include a first portion 160*a* extending along the sidewall of the lower portion 160*bt* of the third trench, and a second portion 160*b* extending along the bottom surface of the lower portion 160*bt* of the third trench.

The first portion 160*a* of the insulating line pattern may be formed along a portion of the sidewall of the third trench 160*t*. The first portion 160*a* of the insulating line pattern may extend along the sidewall of the lower portion 160*bt* of the third trench, and may not extended along the sidewall of the upper portion 160*ut* of the third trench.

The third trench 160*t* may include a first sidewall and a second sidewall facing each other. The first sidewall of the third trench 160*t* may be adjacent to the short side 110*b* of the first fin-type pattern 110, and the second sidewall of the third trench 106*t* may be adjacent to the short side 210*b* of the second fin-type pattern 210.

The first portion 160*a* of the insulating line pattern may include a portion formed on the first sidewall of the third trench 160*t*, and a portion formed on the second sidewall of the third trench 160*t* adjacent to the short side 210*b* of the second fin-type pattern 210.

At this time, the first portion 160*a* of the insulating line pattern formed on the first sidewall of the third trench 160*t* may be spaced apart from the first portion 160*a* of the insulating line pattern formed on the second sidewall of the third trench 160*t*.

An uppermost portion of the insulating line pattern 160 may be lower than the upper surface of the first gate electrode 120 and the upper surface of the second gate electrode 220.

As illustrated in FIG. 4A, the uppermost portion of the insulating line pattern 160 may be positioned at a same height as the upper surface of the first fin-type pattern 110 and the upper surface of the second fin-type pattern 210. In an implementation, as illustrated in FIG. 4B, the uppermost portion of the insulating line pattern 160 may be higher than the upper surface of the first fin-type pattern 110 and the upper surface of the second fin-type pattern 210.

The height from the substrate 100 to the uppermost portion of the insulating line pattern 160 may be H2+H4, and the height from the substrate 100 to the upper surface of the first fin-type pattern 110 may be H2+H5. In an implementation, the height (H2+H4) from the substrate 100 to the uppermost portion of the insulating line pattern 160 may be greater than or equal to the height (H2+H5) from the substrate 100 to the upper surface of the first fin-type pattern 110.

For example, the height H4 of the uppermost portion of the insulating line pattern 160 may be greater than or equal to the height H5 of the upper portion 112 of the first fin-type pattern and the height H5 of the upper portion 212 of the second fin-type pattern, which are protruded upwardly further than the upper surface of the second region 107 of the field insulating film.

A bottom surface of the insulating line pattern 160, e.g., the second portion 160*b* of the insulating line pattern, may be lower than the upper surface of the first fin-type pattern 110 and the upper surface of the second fin-type pattern 210. For example, the second portion 160*b* of the insulating line pattern may be closer to the bottom of the isolating trench T than the upper surface of the first fin-type pattern 110 and the upper surface of the second fin-type pattern 210.

The insulating line pattern 160 may span between the first fin-type pattern 110 and the second fin-type pattern 210. The insulating line pattern 160 may be formed between the first fin-type pattern 110 and the second fin-type pattern 210. For example, the insulating line pattern 160 may span between the short side 110*b* of the first fin-type pattern 110 and the short side 210*b* of the second fin-type pattern 210.

The insulating line pattern 160 may be formed so as to span or be between the first fin-type pattern 110 and the second fin-type pattern 210, in which case the insulating line pattern 160 may not be in contact with the first fin-type pattern 110 and the second fin-type pattern 210.

The first liner 170 and the interlayer insulating film 190 may be interposed between the insulating line pattern 160 and the first fin-type pattern 110, and between the insulating line pattern 160 and the second fin-type pattern 210.

The insulating line pattern 160 may include an insulation material. The insulating line pattern 160 may not include a conductive material. For example, the insulating line pattern 160 may include at least one of silicon oxide, silicon nitride, silicon oxynitride, silicon carbonitride, or silicon oxycarbonitride.

A second liner 175 may be formed along the sidewall and the bottom surface of the third trench 160*t*. For example, the second liner 175 may be formed along the sidewall and the bottom surface of the lower portion 160*bt* of the third trench. For example, the second liner 175 may extend along a portion of the sidewall of the third trench 160*t* and along the bottom surface of the third trench 160*t*.

The second liner 175 may be formed between the insulating line pattern 160 and the first liner 170, and between the insulating line pattern 160 and the second region 107 of the field insulating film.

The second liner 175 may include a first portion extending along the bottom surface of the third trench 160*t*, and a second portion extending along the sidewall of the third trench 160*t*.

The first portion of the second liner 175 may extend along the upper surface of the second region 107 of the field insulating film, between the insulating line pattern 160 and the second region 107 of the field insulating film. The first portion of the second liner 175 may be formed along the second portion 160*b* of the insulating line pattern.

Between the insulating line pattern 160 and the first liner 170, the second portion of the second liner 175 may extend along the inner sidewall of the first liner 170. The second portion of the second liner 175 may be formed along the first portion 160*a* of the insulating line pattern.

For example, the insulating line pattern 160 may be formed along a profile of the second liner 175 on the sidewall and bottom surface of third trench 160*t*.

The uppermost portion of the second liner 175 may be lower than the upper surface of the first gate electrode 120 and the upper surface of the second gate electrode 220. Further, the uppermost portion of the second liner 175 may be higher than or equal to the upper surface of the first fin-type pattern 110 and the upper surface of the second fin-type pattern 210.

In an implementation, as illustrated in FIGS. 4A and 4B, the uppermost portion of the second liner 175 and the uppermost portion of the insulating line pattern 160 may be positioned at the same height.

In an implementation, as illustrated in FIGS. 4A and 4B, an uppermost surface of the second liner 175 and an uppermost surface of the insulating line pattern 160 may be in parallel with the upper surface of the conductive pattern 180. In an implementation, the uppermost surface of the second liner 175 and the uppermost surface of the insulating line pattern 160 may have a slope to the upper surface of the conductive pattern 180.

The second liner 175 may include a material having an etch selectivity to a material included in the first liner 170.

In an implementation, the second liner 175 may include a material having an etch selectivity to a material included in the insulating line pattern 160.

For example, the second liner 175 may include at least one of silicon oxide, silicon nitride, silicon oxynitride, silicon carbonitride, or silicon oxycarbonitride.

The conductive pattern 180 may be formed on the insulating line pattern 160 and the second liner 175. The conductive pattern 180 may extend in the second direction Y.

The conductive pattern 180 may be formed by partially filling the third trench 160*t*. For example, the conductive pattern 180 may be formed by filling the upper portion 160*ut* of the third trench.

The conductive pattern 180 may span or be between the first fin-type pattern 110 and the second fin-type pattern 210. The conductive pattern 180 may be formed between the first fin-type pattern 110 and the second fin-type pattern 210.

The uppermost portion of the insulating line pattern 160 and the uppermost portion of the second liner 175 may be higher than or equal to the upper surface of the first fin-type pattern 110 and the upper surface of the second fin-type pattern 210, and the conductive pattern 180 on the insulating line pattern 160 and the second liner 175 may not be in contact with, e.g., may be completely spaced apart from, the first fin-type pattern 110 and the second fin-type pattern 210.

The upper surface of the conductive pattern 180 may be in the same plane as the upper surface of the first gate electrode 120 and the upper surface of the second gate electrode 220. The upper surface of the conductive pattern 180 may be in the same plane as the upper surface of the interlayer insulating film 190.

As illustrated, the conductive pattern 180 may be formed on the insulating line pattern 160 and the second liner 175, although a portion of the conductive pattern 180 may be formed, extending between the insulating line patterns 160.

For example, a portion of the conductive pattern 180 may be interposed between the first portions 160*a* of the insulating line pattern. The portion of the conductive pattern 180 may fill the lower portion 160*bt* of the third trench.

The conductive pattern 180 may include, e.g., titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or a combination thereof.

In an implementation, the conductive pattern 180 may each include conductive metal oxide, conductive metal oxynitride or the like, or an oxidized form of the aforementioned material.

A first gate insulating film 125 may be formed between the first fin-type pattern 110 and the first gate electrode 120. The first gate insulating film 125 may be formed along a profile of the first fin-type pattern 110 protruding upward further than the field insulating film 105.

In an implementation, the first gate insulating film 125 may be disposed between the first gate electrode 120 and the field insulating film 105. The first gate insulating film 125 may be formed along the sidewall and the bottom surface of the first trench 120t.

A second gate insulating film 225 may be formed between the second fin-type pattern 210 and the second gate electrode 220. The second gate insulating film 225 may be formed along a profile of the second fin-type pattern 210 protruding upwardly further than the field insulating film 105.

In an implementation, the second gate insulating film 225 may be between the second gate electrode 220 and the field insulating film 105. The second gate insulating film 225 may be formed along the sidewall and the bottom surface of the second trench 220t.

In an implementation, unlike the illustration in FIG. 5A, in FIG. 5B, an interfacial layer 121 may be additionally formed between the first gate insulating film 125 and the first fin-type pattern 110. An interfacial layer may be additionally formed between the second gate insulating film 225 and the second fin-type pattern 210.

In an implementation, the interfacial layer may be additionally formed between the first gate insulating film 125 and the first fin-type pattern 110, and also between the second gate insulating film 225 and the second fin-type pattern 210.

In an implementation, as illustrated in FIG. 5B, the interfacial layer 121 may be formed along the profile of the first fin-type pattern 110 which protrudes greater than or from the upper surface of the field insulating film 105.

The interfacial layer 121 may extend along the upper surface of the field insulating film 105 depending on methods for forming the interfacial layer 121.

The first gate insulating film 125 and the second gate insulating film 225 may each include, e.g., silicon oxide, silicon oxynitride, silicon nitride and a high-k dielectric material with a higher dielectric constant than silicon oxide. For example, the high-k dielectric material may include one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

In an implementation, the high-k dielectric material described above may be an oxide or, alternatively, the high-k dielectric material may include one or more of a nitride (e.g., hafnium nitride) and/or oxynitride (e.g., hafnium oxynitride) of the metal materials (e.g., hafnium) described above.

A conductive pattern liner 185 may be formed between the conductive pattern 180 and the insulating line pattern 160, and between the conductive pattern 180 and the first liner 170. The conductive pattern liner 185 may be formed along the inner sidewall of the first liner 170, and along the insulating line pattern 160.

The conductive pattern liner 185 may be formed along the sidewall and the bottom surface of the third trench 160t in which the second liner 175 and the insulating line pattern 160 are formed.

The conductive pattern liner 185 may be formed on the second liner 175 and the insulating line pattern 160. The conductive pattern liner 185 may cover the uppermost surface of the second liner 175 and the uppermost surface of the insulating line pattern 160, respectively. The conductive pattern 180 may be formed on the conductive pattern liner 185.

The conductive pattern liner 185 may include, e.g., high-k dielectric insulating film. The description of the high-k dielectric insulating film may be the same as above.

In an implementation, as illustrated in FIGS. 4A and 4B, the conductive pattern 180 may fill the lower portion 160bt of the third trench in which the conductive pattern liner 185 is formed.

If the lower portion 160bt of the third trench in which the insulating line pattern 160 is formed is entirely filled by the conductive pattern liner 185, a portion of the conductive pattern 180 may not be interposed between the first portions 160a of the insulating line patterns.

A first source/drain 140 may be formed on both sides of the first gate electrode 120. The first source/drain 140 may be formed between the first gate electrode 120 and the insulating line pattern 160.

The first source/drain 140 may be formed by doping impurity in the upper portion 112 of the first fin-type pattern.

A second source/drain 240 may be formed on both sides of the second gate electrode 220. The second source/drain 240 may be formed between the second gate electrode 220 and the insulating line pattern 160.

The second source/drain 240 may be formed by doping impurity in the upper portion 212 of the second fin-type pattern.

The first source/drain 140 and the second source/drain 240 may not be in contact with, e.g., may each be completely spaced apart from, the first liners 170.

In drawings for exemplary embodiments to be described below, the uppermost portion of the insulating line pattern 160 is illustrated as being positioned at the same height as the upper surface of the first fin-type pattern 110 and the upper surface of the second fin-type pattern 210.

Figure 6:
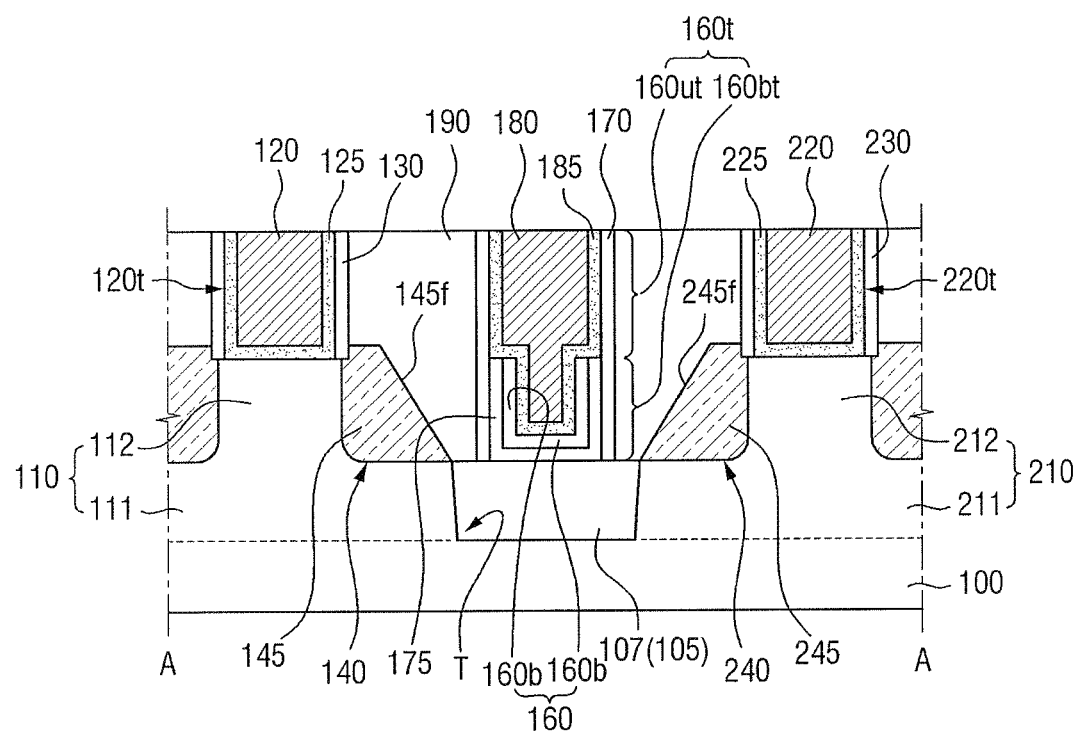
FIG. 6 illustrates a sectional view of a semiconductor device according to some exemplary embodiments.

FIG. 6 illustrates a sectional view of a semiconductor device according to some exemplary embodiments. For convenience of explanation, differences that are not explained above with reference to FIGS. 1 to 5B will be mainly explained below.

Referring to FIG. 6, in the semiconductor device according to some exemplary embodiments, the first source/drain 140 may include a first epitaxial layer 145 on the first fin-type pattern 110, and the second source/drain 240 may include a second epitaxial layer 245 on the second fin-type pattern 210.

The first epitaxial layer 145 may be formed so as to fill a recess formed on the upper portion 112 of the first fin-type pattern. The second epitaxial layer 245 may be formed so as to fill a recess formed on the upper portion 212 of the second fin-type pattern.

In an implementation, as illustrated in FIG. 6, the first epitaxial layer 145 on an end of the first fin-type pattern 110 and the second epitaxial layer 245 on an end of the second fin-type pattern 210 may each include facets 145f and 245f.

When the semiconductor device according to some exemplary embodiments is a PMOS transistor, the first epitaxial layer 145 and the second epitaxial layer 245 may include a compressive stress material. For example, the compressive stress material may be a material such as SiGe that has a higher lattice constant than Si. For example, the compressive stress material may enhance mobility of the carrier in the channel region by exerting compressive stress on the first fin-type pattern 110 and the second fin-type pattern 210.

In an implementation, when the semiconductor device is an NMOS transistor, the first epitaxial layer 145 and the second epitaxial layer 245 may include a tensile stress material. For example, when the first fin-type pattern 110 and the second fin-type pattern 210 are silicon (Si), the first epitaxial layer 145 and the second epitaxial layer 245 may be a material such as SiC that has a smaller lattice constant than the Si. For example, the tensile stress material can enhance mobility of the carrier in the channel region by exerting tensile stress on the first fin-type pattern 110 and the second fin-type pattern 210.

In an implementation, when the first fin-type pattern 110 and the second fin-type pattern 210 are Si, the first epitaxial layer 145 and the second epitaxial layer 245 may be a silicon epitaxial pattern, respectively.

It is thus possible that when the first gate electrode 120 and the second gate electrode 220 are included in different types of MOS transistors, the first epitaxial layer 145 and the second epitaxial layer 245 may include different materials from each other.

Figure 7:
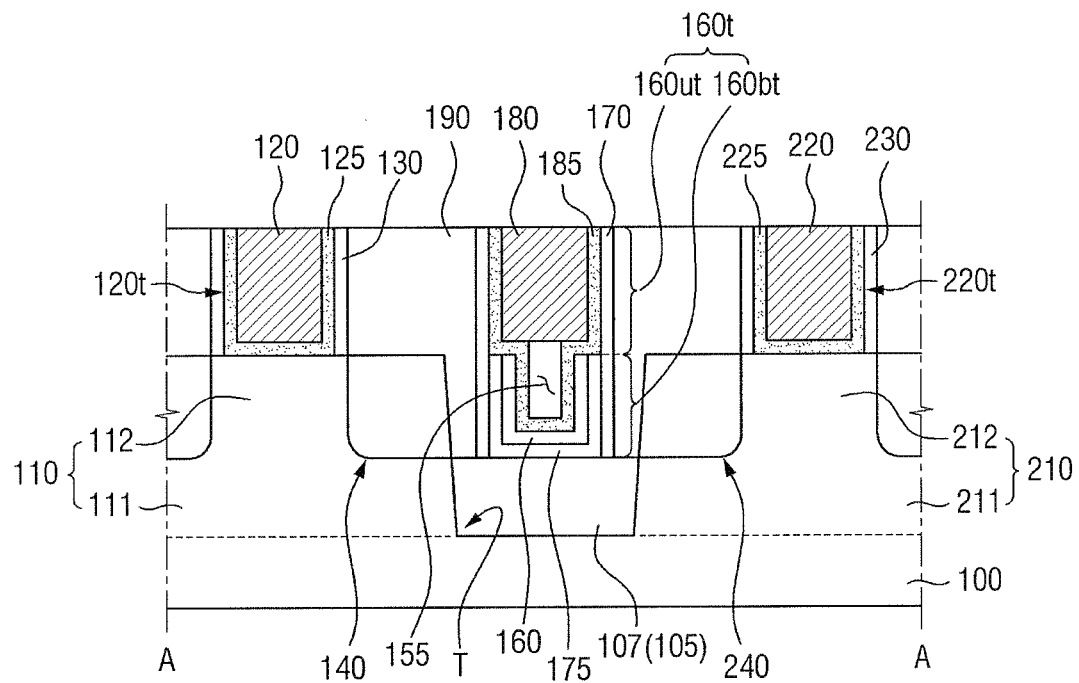
FIG. 7 illustrates a sectional view of a semiconductor device according to some exemplary embodiments.
Figure 8:
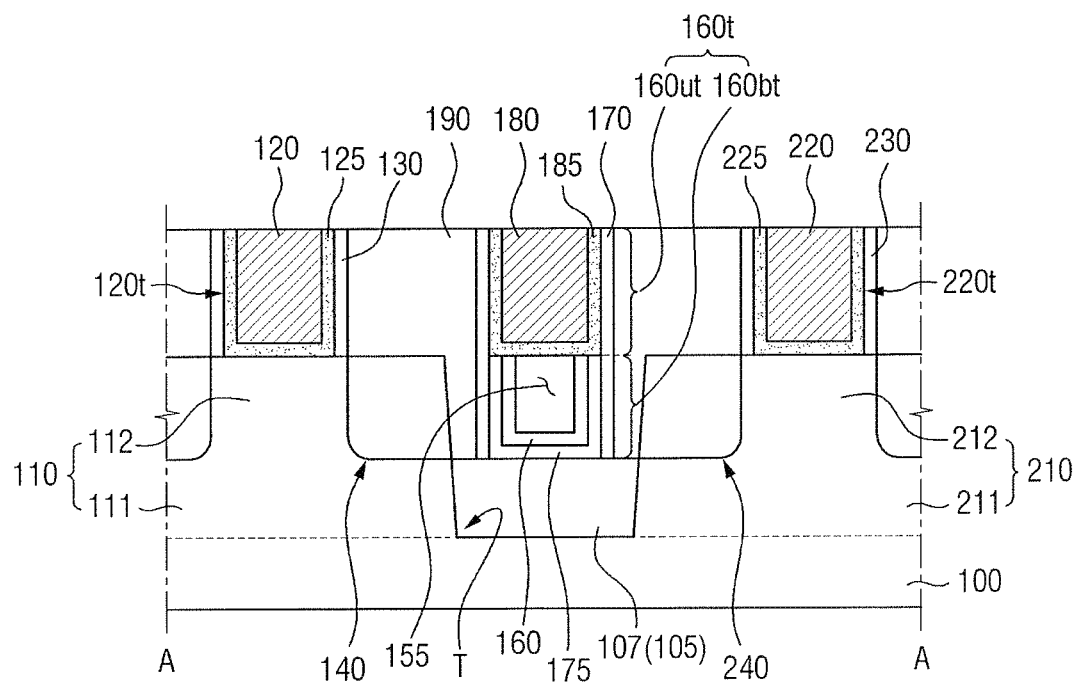
FIG. 8 illustrates a sectional view of a semiconductor device according to some exemplary embodiments.
Figure 9:
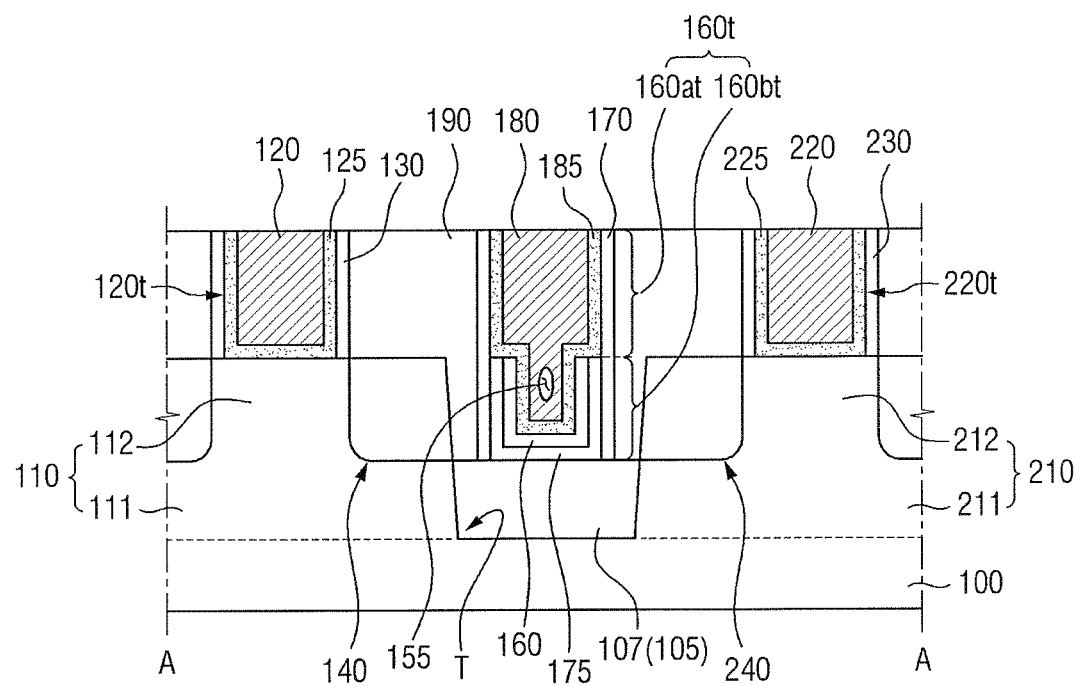
FIG. 9 illustrates a sectional view of a semiconductor device according to some exemplary embodiments.

FIG. 7 illustrates a sectional view of a semiconductor device according to some exemplary embodiments. FIG. 8 illustrates a sectional view of a semiconductor device according to some exemplary embodiments. FIG. 9 illustrates a sectional view of a semiconductor device according to some exemplary embodiments. For convenience of explanation, differences that are not explained above with reference to FIGS. 1 to 5B will be mainly explained below.

Referring to FIG. 7, the semiconductor device according to some exemplary embodiments may additionally include an air gap 155 between the conductive pattern 180 and the conductive pattern liner 185, e.g., between a portion of the conductive pattern 180 and the conductive pattern liner 185.

The conductive pattern liner 185 may extend along the first liner 170 and the insulating line pattern 160.

The conductive pattern 180 may not fill the lower portion 160bt of the third trench in which the conductive pattern liner 185 is formed. Due to reduced step coverage of process for forming the conductive pattern 180 or the process margin, the conductive pattern 180 may not fill the lower portion 160bt of the third trench.

As a result, the air gap 155 may be formed between the conductive pattern 180 and the conductive pattern liner 185.

Referring to FIG. 8, the semiconductor device according to some exemplary embodiments may additionally include an air gap 155 between the conductive pattern liner 185 and the insulating line pattern 160, e.g., between a portion of the conductive pattern liner 185 and the insulating line pattern 160.

The conductive pattern liner 185 may not be formed along the sidewall and the bottom surface of the lower portion 162t of the third trench in which the insulating line pattern 160 is formed. Due to reduced step coverage of process for forming the conductive pattern liner 185 or the process margin, the conductive pattern liner 185 may not be formed along a profile of the insulating line pattern 160.

As a result, the air gap 155 may be formed between the conductive pattern liner 185 and the insulating conductive pattern 160.

Referring to FIG. 9, in the semiconductor device according to some exemplary embodiments, the conductive pattern 180 may include an air gap 155 therein.

The conductive pattern liner 185 may extend along the first liner 170 and the insulating line pattern 160. Further, a portion of the conductive pattern 180 may fill the lower portion 160bt of the third trench.

However, during formation of the conductive pattern 180, an overhang may be formed near the uppermost portion of the insulating line pattern 160, and the conductive pattern 180 may not entirely fill the lower portion 160bt of the third trench. This is because the step coverage of process for forming the conductive pattern 180 may be reduced.

Accordingly, the air gap 155 may be formed within the conductive pattern 180.

Figure 10:
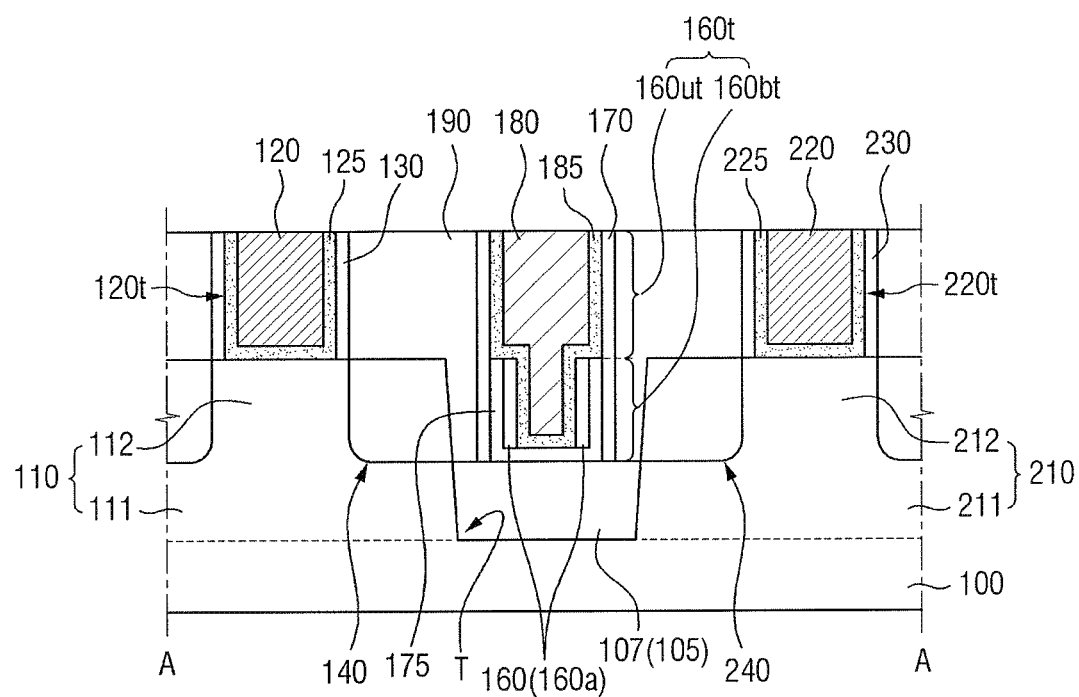
FIG. 10 illustrates a sectional view of a semiconductor device according to some exemplary embodiments.

FIG. 10 illustrates a sectional view of a semiconductor device according to some exemplary embodiments. For convenience of explanation, differences that are not explained above with reference to FIGS. 1 to 5B will be mainly explained below.

Referring to FIG. 10, in the semiconductor device according to some exemplary embodiments, the insulating line pattern 160 may be formed on the sidewall of the lower portion 160bt of the third trench, and may not be formed on the bottom surface of the lower portion 160bt of the third trench.

For example, the insulating line pattern 160 may include a first portion 160a of the insulating line pattern extending along the sidewall of the lower portion 160bt of the third trench. The insulating line pattern 160 may not include a second portion 160b (FIG. 4) of the insulating line pattern extending along the bottom surface of the lower portion 160bt of the third trench.

Figure 11:
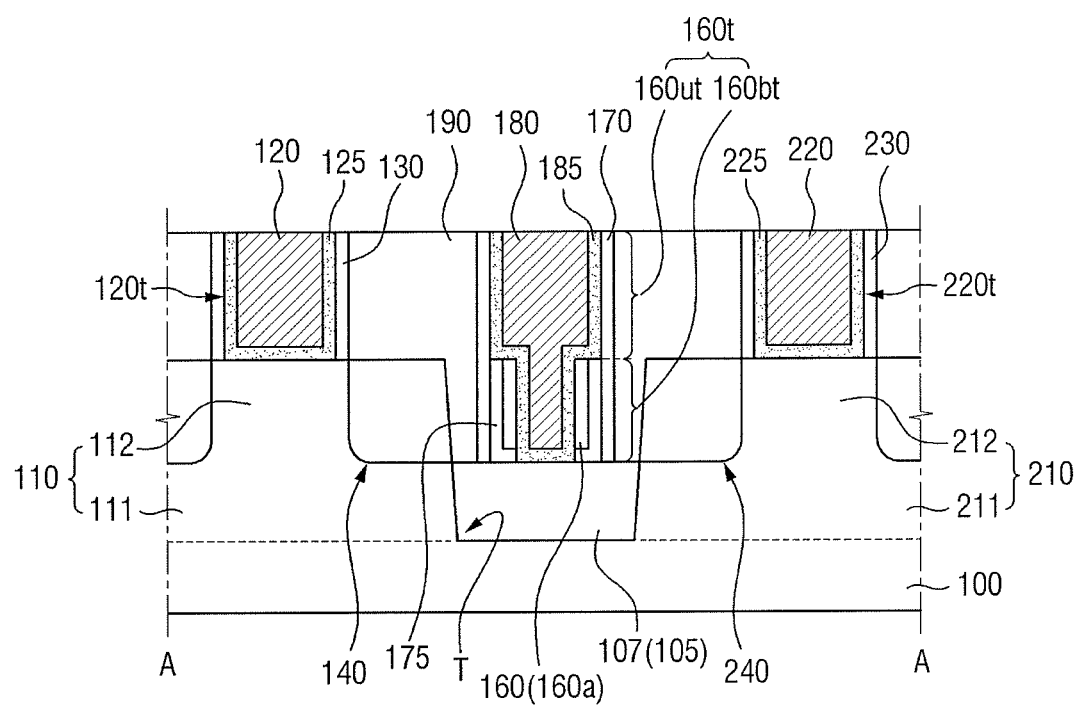
FIG. 11 illustrates a sectional view of a semiconductor device according to some exemplary embodiments.

FIG. 11 illustrates a sectional view of a semiconductor device according to some exemplary embodiments. For convenience of explanation, differences that are not explained above with reference to FIGS. 1 to 5B will be mainly explained below.

Referring to FIG. 11, in the semiconductor device according to some exemplary embodiments, the conductive pattern liner 185 on the bottom surface of the lower portion 160bt of the third trench may be in contact with the field insulating film 105.

The second liner 175 may be formed on the sidewall of the lower portion 160bt of the third trench, and may not be formed on a portion of the bottom surface of the lower portion 160bt of the third trench.

The second liner 175 on the sidewall of the third trench 160t facing each other may include a portion extending on the sidewall of the third trench 160t and a portion formed on the bottom surface of the third trench 160t, respectively. The second liner 175 formed on the second region 107 of the field insulating film may have, e.g., an L-shape.

The insulating line pattern 160 may be formed on the second liner 175 on the sidewall of the third trench 160t facing each other. The insulating line pattern 160 may include a first portion 160a of the insulating line pattern extending along the sidewall of the lower portion 160bt of the third trench. The insulating line pattern 160 may not include a second portion 160b (FIG. 4) of the insulating line pattern extending along the bottom surface of the lower portion 160bt of the third trench.

Figure 12:
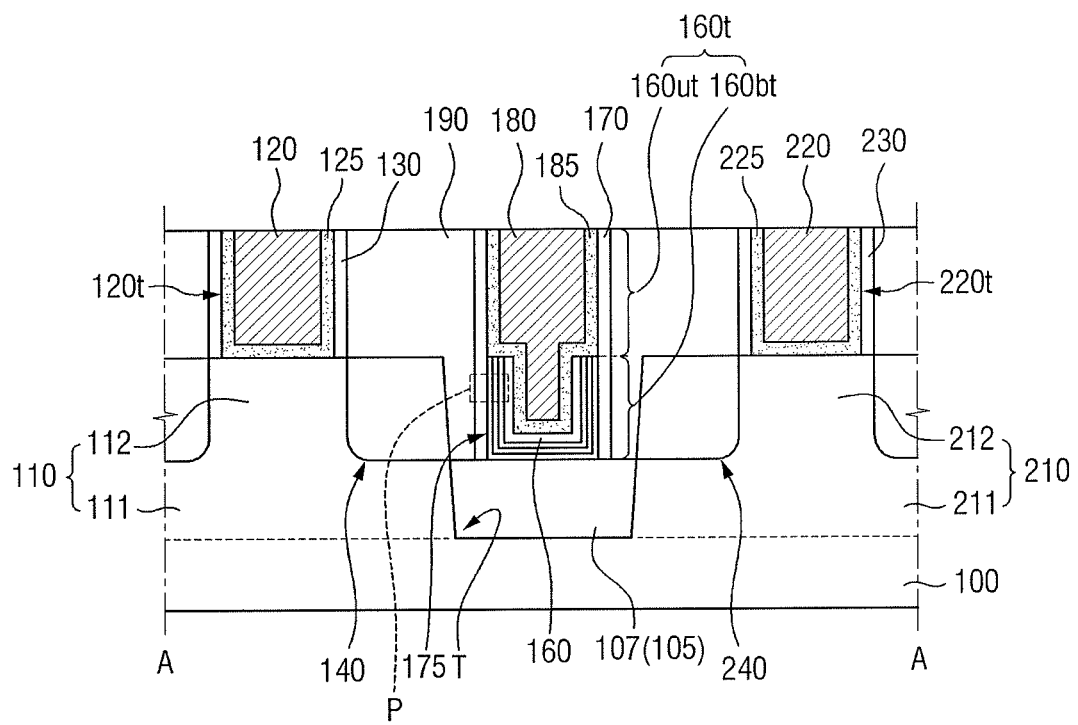
FIG. 12 illustrates a sectional view of a semiconductor device according to some exemplary embodiments.
Figure 13:
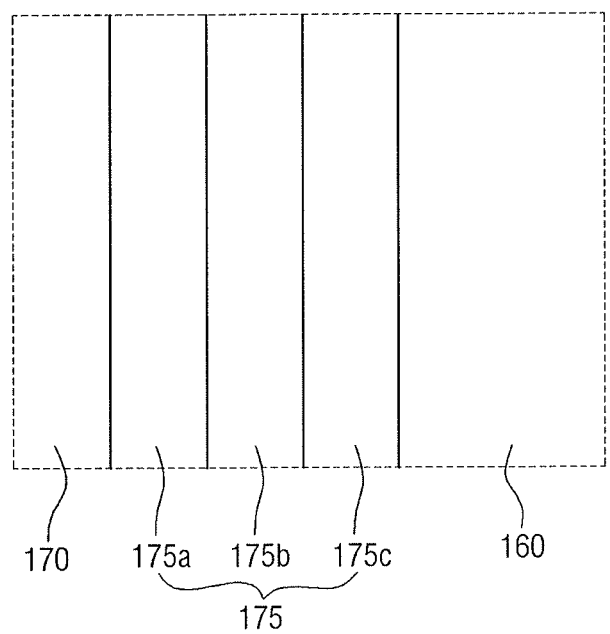
FIG. 13 illustrates an enlarged view of the area P of FIG. 12.

FIG. 12 illustrates a sectional view of a semiconductor device according to some exemplary embodiments. FIG. 13 illustrates an enlarged view of the area P of FIG. 12. For convenience of explanation, differences that are not explained above with reference to FIGS. 1 to 5B will be mainly explained below.

Referring to FIGS. 12 and 13, in the semiconductor device according to some exemplary embodiments, the second liner 175 may include a first film 175a, a second film 175b, and a third film 175c stacked in a sequential order on the second region 107 of the field insulating film.

The first film 175a may be formed along a sidewall and a bottom surface of the third trench 160t. The first film 175a may be formed along the upper surface of the field insulating film 105 and along a sidewall of the first liner 170.

The second film 175b may be formed along a sidewall and a bottom surface of the third trench 160t in which the first film 175a is formed, and the third film 175c may be formed along a sidewall and a bottom surface of the third trench 160t in which the second film 175b is formed.

FIG. 13 illustrates the second liner 175 including three layers stacked on the first liner 170 in a sequential order.

The second film 175b may include a material having an etch selectivity to a material included in the first film 175a. In an implementation, the second film 175b may include a material having an etch selectivity to a material included in the third film 175c.

For example, the first film 175a and the third film 175c may include at least one of silicon oxide, silicon nitride, silicon oxynitride, silicon carbonitride, or silicon oxycarbonitride, respectively. In an implementation, second film 175b may include, e.g., silicon, silicon germanium, or germanium.

Figure 14:
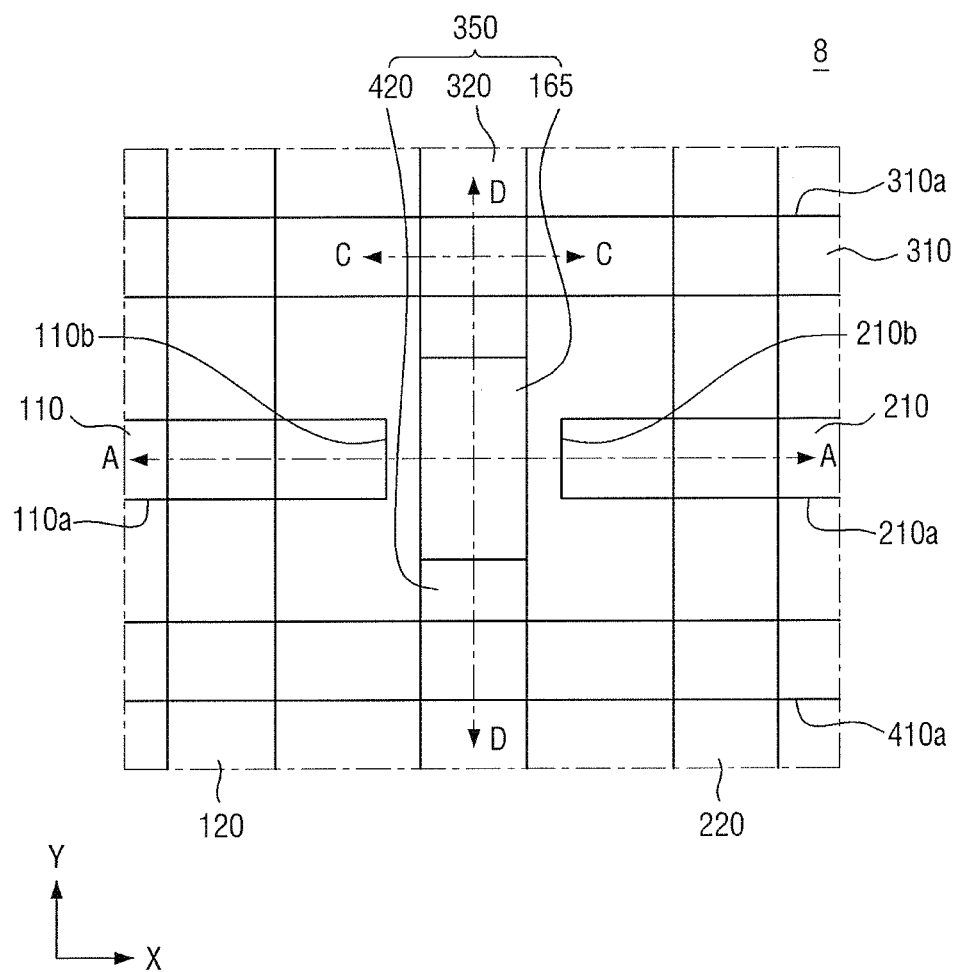
FIG. 14 illustrates a layout diagram of a semiconductor device according to some exemplary embodiments.
Figure 15:
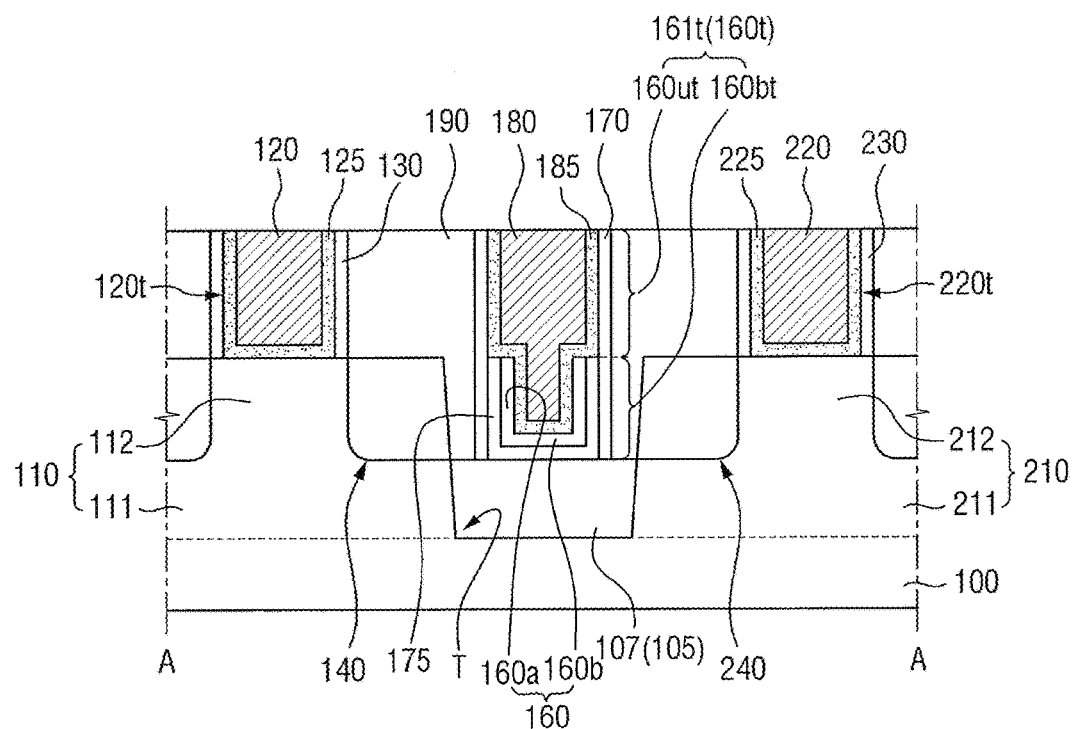
FIG. 15 illustrates a cross sectional view taken on line A-A of FIG. 14.
Figure 16:
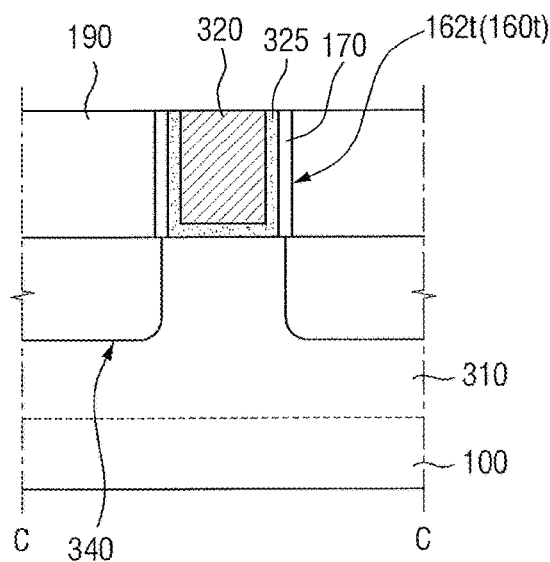
FIG. 16 illustrates a cross sectional view taken on line C-C of FIG. 14.
Figure 17:
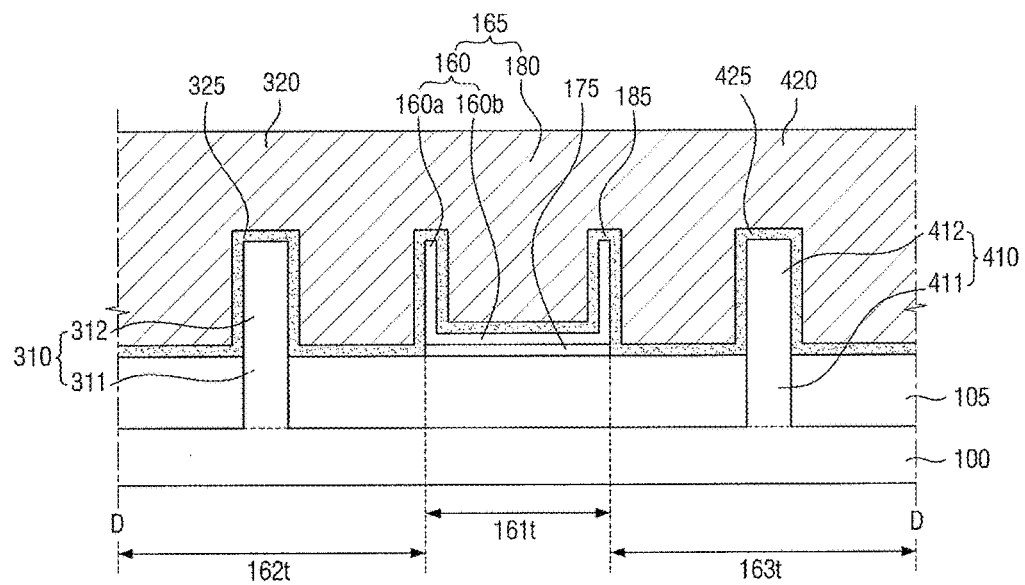
FIG. 17 illustrates a cross sectional view taken on line D-D of FIG. 14.

FIG. 14 illustrates a layout diagram of a semiconductor device according to some exemplary embodiments. FIG. 15 illustrates a cross sectional view taken on line A-A of FIG. 14. FIG. 16 illustrates a cross sectional view taken on line C-C of FIG. 14. FIG. 17 illustrates a cross sectional view taken on line D-D of FIG. 14.

For convenience of explanation, differences that are not explained above with reference to FIGS. 1 to 5B will be mainly explained below.

In an implementation, the cross sectional view taken on line A-A of FIG. 14 may be illustrated in a similar manner as FIG. 4. Accordingly, the cross sectional view taken on line A-A of FIG. 14 may be illustrated in a similar manner as FIG. 6.

Referring to FIGS. 14 to 17, a semiconductor device according to some exemplary embodiments may include, e.g., a first fin-type pattern 110, a second fin-type pattern 210, a third fin-type pattern 310, a fourth fin-type pattern 410, a first gate electrode 120, a second gate electrode 220, and a connect gate pattern 350.

The third fin-type pattern 310 may be elongated or extend in a first direction X. The first fin-type pattern 110 and the third fin-type pattern 310 may be elongated or extend in the first direction X, and the first fin-type pattern 110 and the third fin-type pattern 310 may be arranged in (e.g., spaced apart along) a second direction Y. In an implementation, the second fin-type pattern 210 and the third fin-type pattern 310 may be arranged in (e.g., spaced apart along) the second direction Y.

For example, the long side 110a of the first fin-type pattern 110 and the long side 310a of the third fin-type pattern 310 may be facing each other, and the long side 210a of the second fin-type pattern 210 and the long side 310a of the third fin-type pattern 310 may be facing each other.

The fourth fin-type pattern 410 may be elongated in the first direction X. The fourth fin-type pattern 410 may be formed in parallel with the third fin-type pattern 310. The third fin-type pattern 310 and the fourth fin-type pattern 410 may be arranged in (e.g., spaced apart along) the second direction Y.

Between the third fin-type pattern 310 and the fourth fin-type pattern 410, the first fin-type pattern 110 and the second fin-type pattern 210 may be disposed. The first fin-type pattern 110 and the second fin-type pattern 210 may be aligned longitudinally or laterally in the first direction X, between the third fin-type pattern 310 and the fourth fin-type pattern 410.

For example, the long side 110a of the first fin-type pattern 110 and the long side 410a of the fourth fin-type pattern 410 may be facing each other, and the long side 210a of the second fin-type pattern 210 and the long side 410a of the fourth fin-type pattern 410 may be facing each other.

The first to fourth fin-type patterns 110, 210, 310 and 410 may extend in the first direction X, respectively. The first fin-type pattern 110, the third fin-type pattern 310, and the fourth fin-type pattern 410 may be arranged in the second direction Y, and the second fin-type pattern 210, the third fin-type pattern 310, and the fourth fin-type pattern 410 may be arranged in the second direction Y.

The field insulating film 105 may be formed around the third fin-type pattern 310 and the fourth fin-type pattern 410. The field insulating film 105 may partially cover the third fin-type pattern 310 and the fourth fin-type pattern 410. The third fin-type pattern 310 and the fourth fin-type pattern 410 may be defined by the field insulating film 105.

The upper surface of the field insulating film 105 in contact with the long side 310a of the third fin-type pattern 310 and the long side 410a of the fourth fin-type pattern 410 may be lower than the upper surface of the third fin-type pattern 310 and the upper surface of the fourth fin-type pattern 410.

Repeated descriptions of the third fin-type pattern 310 and the fourth fin-type pattern 410 may be omitted below, but may be understood based on the description provided above about the first fin-type pattern 110 and the second fin-type pattern 210.

FIG. 14 illustrates that one of the fin-type patterns, viz., the first fin-type pattern 110 or the second fin-type pattern 210, may be located between the third fin-type pattern 310 and the fourth fin-type pattern 410.

The connect gate pattern 350 may be elongated in the second direction Y. The connect gate pattern 350 may be formed in the third trench 160t.

The connect gate pattern 350 may be formed on the third fin-type pattern 310, the fourth fin-type pattern 410, and the field insulating film 105. However, the connect gate pattern 350 may not be formed on the first fin-type pattern 110 and the second fin-type pattern 210.

The connect gate pattern 350 may be formed so as to intersect the third fin-type pattern 310 and the fourth fin-type pattern 410. However, the connect gate pattern 350 may not intersect the first fin-type pattern 110 and the second fin-type pattern 210.

The connect gate pattern 350 may be formed so as to span between the first fin-type pattern 110 and the second fin-type pattern 210. That is, the connect gate pattern 350 may span between the short side 110b of the first fin-type pattern 110 and the short side 210b of the second fin-type pattern 210.

Accordingly, the third fin-type pattern 310 and the fourth fin-type pattern 410 may be the neighboring fin-type patterns which are intersected by the connect gate pattern 350. That is, with reference to the connect gate pattern 350, there may not be any fin-type patterns protruding upward further than the upper surface of the field insulating film 105 between the third fin-type pattern 310 and the fourth fin-type pattern 410.

The connect gate pattern 350 may include the third gate electrode 320, the fourth gate electrode 420, and a connect pattern 165. The connect pattern 165 may be disposed between the third gate electrode 320 and the fourth gate electrode 420.

The connect pattern 165 may connect the third gate electrode 320 and the fourth gate electrode 420. The connect pattern 165 may be in contact with the third gate electrode 320 and the fourth gate electrode 420.

The connect pattern 165 may include an insulating line pattern 160 on the field insulating film 105 between the first fin-type pattern 110 and the second fin-type pattern 210, and a conductive pattern 180 on the insulating line pattern 160.

For example, the conductive pattern 180 may directly connect the third gate electrode 320 and the fourth gate electrode 420.

The third gate electrode 320 may intersect the third fin-type pattern 310. The fourth gate electrode 420 may intersect the fourth fin-type pattern 410.

The third gate electrode 320 and the fourth gate electrode 420 may not pass through between the first fin-type pattern 110 and the second fin-type pattern 210. For example, the third gate electrode 320 and the fourth gate electrode 420 may not pass or be present between the short side 110b of the first fin-type pattern 110 and the short side 210b of the second fin-type pattern 210.

The connect pattern 165 may not be formed on the third fin-type pattern 310 and the fourth fin-type pattern 410. The connect pattern 165 may not intersect the third fin-type pattern 310 and the fourth fin-type pattern 410, respectively.

The connect pattern 165 may not be in contact with (e.g., may be completely spaced apart from) the first fin-type pattern 110 and the second fin-type pattern 210. For example, the insulating line pattern 160 and the conductive pattern 180 may not be in contact with the first fin-type pattern 110 and the second fin-type pattern 210, respectively.

The connect gate pattern 350, i.e., the third gate electrode 320, the fourth gate electrode 420, and the connect pattern 165, may be formed in the third trench 160t. The third trench 160t may include a first portion 161t, a second portion 162t, and a third portion 163t.

The first portion 161t of the third trench may include a portion located between the short side 110b of the first fin-type pattern 110 and the short side 210b of the second fin-type pattern 210. The second portion 162t of the third trench may intersect the third fin-type pattern 310 to expose a portion of the third fin-type pattern 310. The third portion 163t of the third trench may intersect the fourth fin-type pattern 410 to expose a portion of the fourth fin-type pattern 410.

In this case, the connect pattern 165 may be formed by filling the first portion 161t of the third trench, the third gate electrode 320 may be formed by filling the second portion 162t of the third trench, and the fourth gate electrode 420 may be formed by filling the third portion 163t of the third trench.

A portion in which the insulating line pattern 160 included in the connect pattern 165 is formed may be defined as a first portion 161t of the third trench. In an implementation, with reference to the insulating line pattern 160 included in the connect pattern 165, a portion intersecting the third fin-type pattern 310 may be defined as a second portion 162t of the third trench, and a portion intersecting with the fourth fin-type pattern 410 may be defined a third portion 163t of the third trench.

The insulating line pattern 160 may be formed on the field insulating film 105 located between the third fin-type pattern 310 and the fourth fin-type pattern 410.

The insulating line pattern 160 may include a first portion 160a of the insulating line pattern protruded from the upper surface of the field insulating film 105, and a second portion 160b of the insulating line pattern extending along the upper surface of the field insulating film 105.

In an implementation, as illustrated in FIG. 17, the first portion 160a of the insulating line pattern may be a pair of protruding insulating patterns protruding from the upper surface of the field insulating film 105. In an implementation, the second portion 160b of the insulating line pattern may be an extending insulating pattern extending along the upper surface of the field insulating film 105. The pair of the protruding insulating patterns may be connected by the extending insulating pattern.

The second liner 175 may be located between the insulating line pattern 160 and the field insulating film 105. The second liner 175 may extend along the upper surface of the field insulating film 105.

In an implementation, as illustrated in FIG. 17, the second liner 175 may not include a portion protruding from the upper surface of the field insulating film 105.

The conductive pattern 180 may be formed on the insulating line pattern 160. The conductive pattern 180 may also be formed between first portions 160a of the pair of the insulating line patterns protruding from the upper surface of the field insulating film 105.

A height from the upper surface of the field insulating film 105 to the upper surface of the conductive pattern 180 may be greater than a height from the upper surface of the field insulating film 105 to the uppermost portion of the first portion 160a of the insulating line pattern.

The third gate electrode 320 may be formed so as to extend in the second direction Y and intersect the third fin-type pattern 310. The third gate electrode 320 may be formed on the third fin-type pattern 310 and the field insulating film 105.

The third gate electrode 320 may surround the third fin-type pattern 310 protruding upward further than the upper surface of the field insulating film 105, i.e., may surround the upper portion 312 of the third fin-type pattern.

The fourth gate electrode 420 may be formed so as to extend in the second direction Y and intersect the fourth fin-type pattern 410. The fourth gate electrode 420 may be formed on the fourth fin-type pattern 410 and the field insulating film 105.

The fourth gate electrode 420 may surround the fourth fin-type pattern 410 protruding upward further than the upper surface of the field insulating film 105, i.e., may surround the upper portion 412 of the fourth fin-type pattern.

The third gate electrode 320, the fourth gate electrode 420, and the conductive pattern 180 may be connected with each other. The third gate electrode 320, the fourth gate electrode 420, and the conductive pattern 180 may be electrically connected with each other.

The upper surface of the third gate electrode 320, the upper surface of the fourth gate electrode 420, and the upper surface of the conductive pattern 180 may be located in the same plane, e.g., may be coplanar with one another.

In an implementation, the third gate electrode 320 and the fourth gate electrode 420 may include, e.g., titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or a combination thereof.

In an implementation, the third gate electrode 320 and the fourth gate electrode 420 may each include a conductive metal oxide, a conductive metal oxynitride, and so on, and may include an oxidized form of the materials described above.

The third gate insulating film 325 may include a portion that extends along the first portion 160a of the insulating line pattern facing the third gate electrode 320. For example, a portion of the third gate insulating film 325 may be formed between the third gate electrode 320 and the insulating line pattern 160.

A portion of the third gate insulating film 325 may extend between the third gate electrode 320 and the first portion 160a of the insulating line pattern facing each other. The third gate insulating film 325 may be connected with the conductive pattern liner 185 formed along the profile of the insulating line pattern 160.

In an implementation, the third gate insulating film 325 may not extend between the second portion 160b of the insulating line pattern and the upper surface of the field insulating film 105. Accordingly, the third gate insulating film 325 may define the second portion 162t of the third trench in which the third gate electrode 320 is formed.

The fourth gate insulating film 425 may be formed between the fourth fin-type pattern 410 and the fourth gate electrode 420. The fourth gate insulating film 425 may be formed along a profile of the fourth fin-type pattern 410 protruding upward further than the field insulating film 105.

In an implementation, the fourth gate insulating film 425 may be between the fourth gate electrode 420 and the field insulating film 105. The fourth gate insulating film 425 may be formed along the sidewall and the bottom surface of the third portion 163t of the third trench.

The fourth gate insulating film 425 may include a portion that extends along the sidewall of the first portion 160a of the insulating line pattern 160 facing the fourth gate electrode 420. For example, a portion of the fourth gate insulating film 425 may be formed between the fourth gate electrode 420 and the first portion 160a of the insulating line pattern.

A portion of the fourth gate insulating film 425 may extend between the fourth gate electrode 420 and the first portion 160a of the insulating line pattern facing each other. The fourth gate insulating film 425 may be connected with the conductive pattern liner 185 formed along the profile of the insulating line pattern 160.

In an implementation, the fourth gate insulating film 425 may not extend between the second portion 160b of the insulating line pattern and the upper surface of the field insulating film 105. Accordingly, the fourth gate insulating film 425 may define the third portion 163t of the third trench in which the fourth gate electrode 420 is formed.

The third gate insulating film 325 and the fourth gate insulating film 425 may each include, e.g., silicon oxide, silicon oxynitride, silicon nitride, and/or a high-k dielectric material with a higher dielectric constant than silicon oxide.

As described above, the conductive pattern liner 185 formed on the insulating line pattern 160 may be connected with the third gate insulating film 325, and the fourth gate insulating film 425, respectively. Further, the conductive pattern liner 185, the third gate insulating film 325 and the fourth gate insulating film 425 may each include a high-k dielectric insulating film.

The conductive pattern liner 185 may be formed when the third gate insulating film 325 and the fourth gate insulating film 425 are formed.

As such, the conductive pattern liner 185, the third gate insulating film 325, and the fourth gate insulating film 425 may be the high-k dielectric gate insulating films which are formed along the profile of the third fin-type pattern 310 and the profile of the fourth fin-type pattern 410, protruding greater than the upper surface of the field insulating film 105, along the profile of the insulating line pattern 160, and along the profile of the field insulating film 105.

The first liner 170 may extend on the sidewall of the third gate electrode 320 and the sidewall of the fourth gate electrode 420.

For example, the third source/drain 340 may be formed on both sides of the third gate electrode 320. The third source/drain 340 may be formed by doping impurity in the third fin-type pattern 310.

Figure 18:
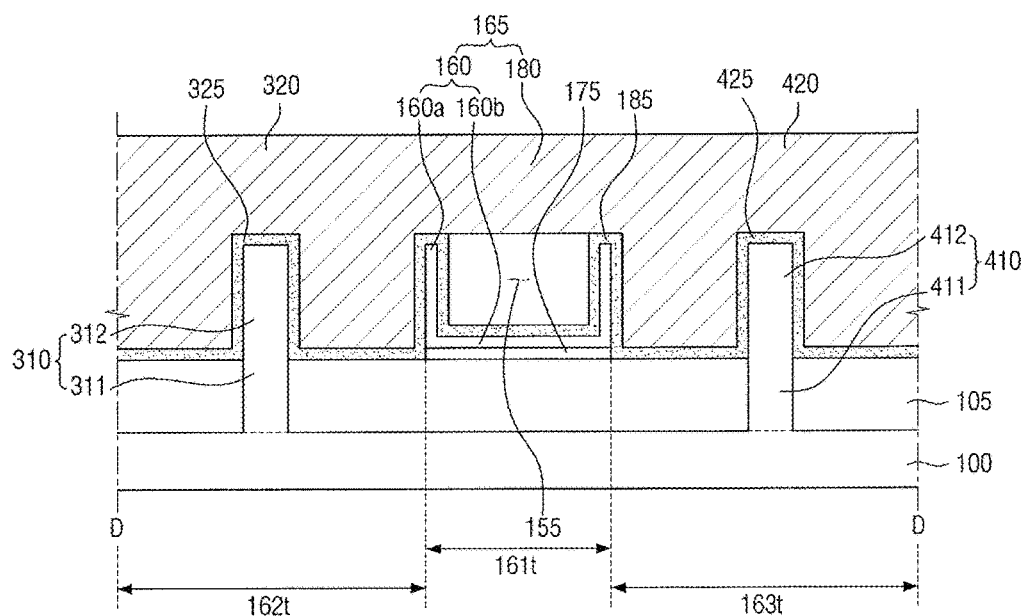
FIG. 18 illustrates a sectional view of a semiconductor device according to some exemplary embodiments.
Figure 19:
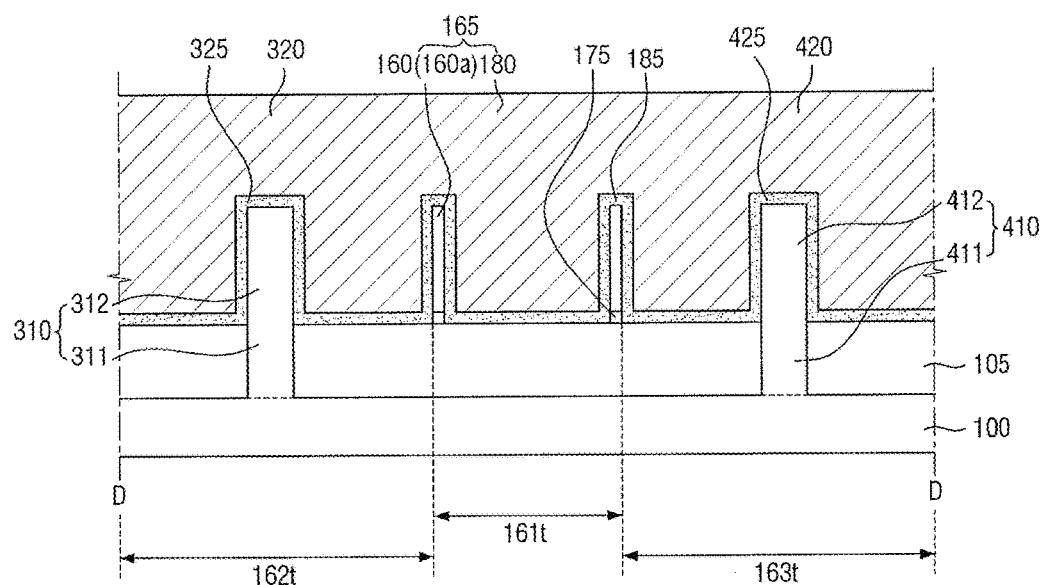
FIG. 19 illustrates a sectional view of a semiconductor device according to some exemplary embodiments.

FIG. 18 illustrates a sectional view of a semiconductor device according to some exemplary embodiments. FIG. 19 illustrates a sectional view of a semiconductor device according to some exemplary embodiments. For convenience of explanation, differences that are not explained above with reference to FIGS. 14 to 17 will be mainly explained below.

For reference, FIGS. 18 and 19 are cross sectional views taken on line D-D of FIG. 14. Further, the cross sectional view related to FIG. 18 taken on line A-A of FIG. 14 may be similar to FIG. 7, and the cross sectional view related to FIG. 19 taken on line A-A of FIG. 14 may be similar to FIG. 11.

Referring to FIG. 18, in the semiconductor device according to some exemplary embodiments, an air gap 155 may be formed between the conductive pattern 180 and the insulating line pattern 160.

The air gap 155 may be formed in a portion defined as the first portion 161t of the third trench.

The air gap 155 may be located on the field insulating film 105 between the third fin-type pattern 310 and the fourth fin-type pattern 410.

Referring to FIG. 19, in the semiconductor device according to some exemplary embodiments, the conductive pattern liner 185 formed on the first portion 161t of the third trench may be in contact with the field insulating film 105.

The insulating line pattern 160 may include a first portion 160a of the insulating line pattern protruding upward further than the upper surface of the field insulating film 105, and not a second portion 160b of the insulating line pattern extending along the upper surface of the field insulating film 105.

In an implementation, the second liner 175 may extend between the insulating line pattern 160 and the upper surface of the field insulating film 105. For example, the second liner 175 may not include a portion extending along the upper surface of the field insulating film 105.

Figure 20:
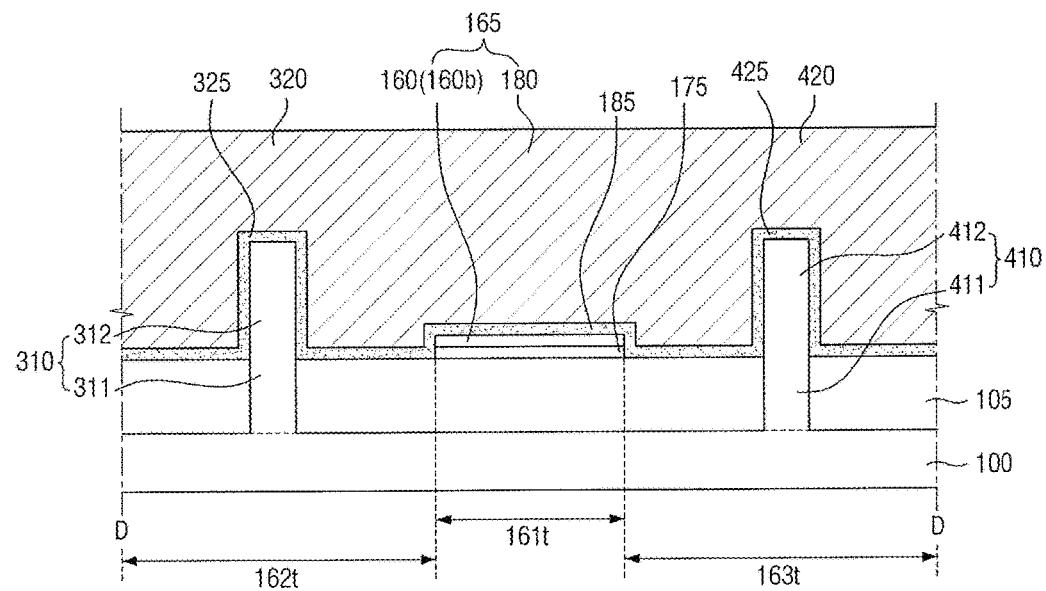
FIG. 20 illustrates a sectional view of a semiconductor device according to some exemplary embodiments.

FIG. 20 illustrates a sectional view of a semiconductor device according to some exemplary embodiments. For convenience of explanation, differences that are not explained above with reference to FIGS. 14 to 17 will be mainly explained below.

For reference, a cross sectional view related with FIG. 20 taken on line A-A of FIG. 14 may be similar to FIG. 4 or FIG. 6.

Referring to FIG. 20, in the semiconductor device according to some exemplary embodiments, the insulating line pattern 160 may not include the first portion 160a of the insulating line pattern protruding from the upper surface of the field insulating film 105.

In an implementation, the insulating line pattern 160 may include a second portion 160b of the insulating line pattern extending along the upper surface of the field insulating film 105.

On the bottom surface of the first portion 161t of the third trench, the second liner 175 and the insulating line pattern 160 may be formed in a plate-like shape in a sequential order.

Hereinbelow, a method for fabricating a semiconductor device according to some exemplary embodiments will be described with reference to FIGS. 4 and 21 to 33.

FIGS. 21 to 33 illustrate sectional view of stages in a method of fabrication of a semiconductor device according to some exemplary embodiments.

Figure 21:
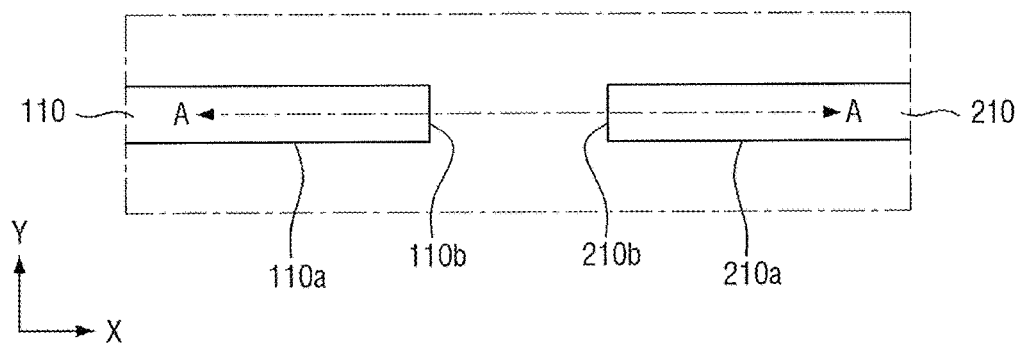
FIGS. 21 to 33 illustrate sectional views of stages in an method of fabrication of a semiconductor device according to some exemplary embodiments.
Figure 22:
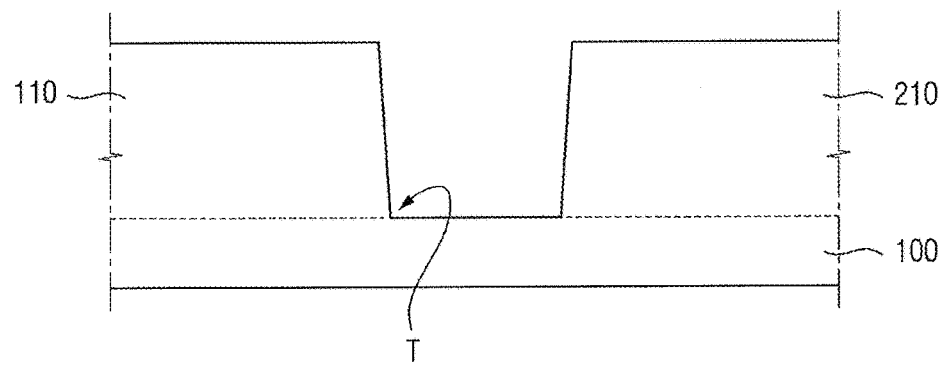

Referring to FIGS. 21 and 22, the first fin-type pattern 110 and the second fin-type pattern 210 elongated or extending in the first direction X may be formed on the substrate 100.

The first fin-type pattern 110 and the second fin-type pattern 210 may be longitudinally or laterally aligned in the first direction X.

The long side 110a of the first fin-type pattern 110 and the long side 210a of the second fin-type pattern 210 may extend in the first direction X. The short side 110b of the first fin-type pattern 110 and the short side 210b of the second fin-type pattern 210, extending in the second direction Y, may be facing each other.

The isolating trench T (for isolating the first fin-type pattern 110 from the second fin-type pattern 210) may be formed between the first fin-type pattern 110 and the second fin-type pattern 210.

In an implementation, the upper surface of the first fin-type pattern 110 and the upper surface of the second fin-type pattern 210 may be exposed. In an implementation, on the upper surface of the first fin-type pattern 110 and the upper surface of the second fin-type pattern 210, the remainder of the mask pattern used in the process of forming the first fin-type pattern 110 and the second fin-type pattern 210 may remain.

The following description is based on a cross sectional view taken on line A-A of FIG. 21.

Figure 23:
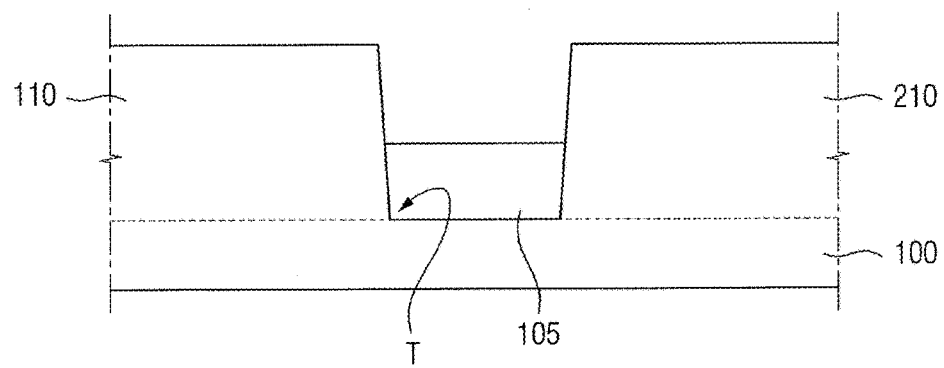

Referring to FIG. 23, a field insulating film 105, partially covering the first fin-type pattern 110 and the second fin-type pattern 210, may be formed.

The field insulating film 105 may partially fill the isolating trench T between the first fin-type pattern 110 and the second fin-type pattern 210.

In an implementation, the process of forming the field insulating film 105 (for partially covering the first fin-type pattern 110 and the second fin-type pattern 210) may include doping (for the purpose of adjusting threshold voltage) on the first fin-type pattern 110 and the second fin-type pattern 210.

Figure 24:
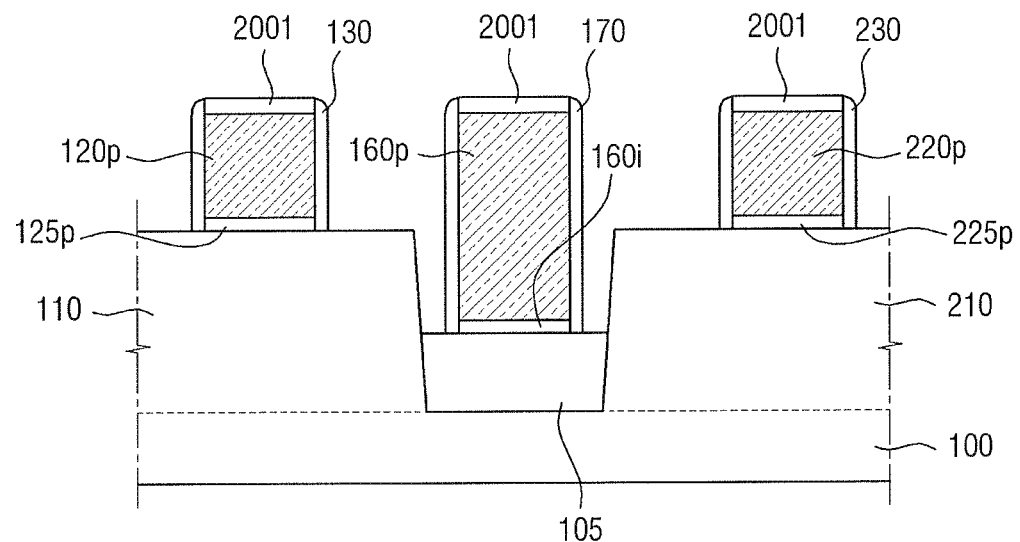

Referring to FIG. 24, using a first mask pattern 2001, an etching process may be performed, thus forming a first dummy gate electrode 120p, a second dummy gate electrode 220p and a third dummy gate electrode 160p.

The first dummy gate electrode 120p may extend in the second direction Y and may be formed on the first fin-type pattern 110. A first dummy gate insulating film 125p may be formed between the first dummy gate electrode 120p and the first fin-type pattern 110.

The second dummy gate electrode 220p may extend in the second direction Y and be formed on the second fin-type pattern 210. The second dummy gate insulating film 225p may be formed between the second dummy gate electrode 220p and the second fin-type pattern 210.

The third dummy gate electrode 160p may extend in the second direction Y and may be formed between the first fin-type pattern 110 and the second fin-type pattern 210. The third dummy gate electrode 160p may be formed on the field insulating film 105 between the short side of the first fin-type pattern 110 and the short side of the second fin-type pattern 210.

In an implementation, the third dummy gate insulating film 160i may be formed between the third dummy gate electrode 160p and the field insulating film 105.

In an implementation, depending on a method used for forming the first dummy gate insulating film 125p and the second dummy gate insulating film 225p, the third dummy gate insulating film 160i may be omitted between the third dummy gate electrode 160p and the field insulating film 105.

In an implementation, the first to third dummy gate electrodes 120p, 220p, and 160p may each include, e.g., polysilicon or amorphous silicon.

The first spacer 130 may then be formed on the sidewall of the first dummy gate electrode 120p, followed by forming of the second spacer 230 on the sidewall of the second dummy gate electrode 220p and the first liner 170 on the sidewall of the third dummy gate electrode 160p.

Figure 25:
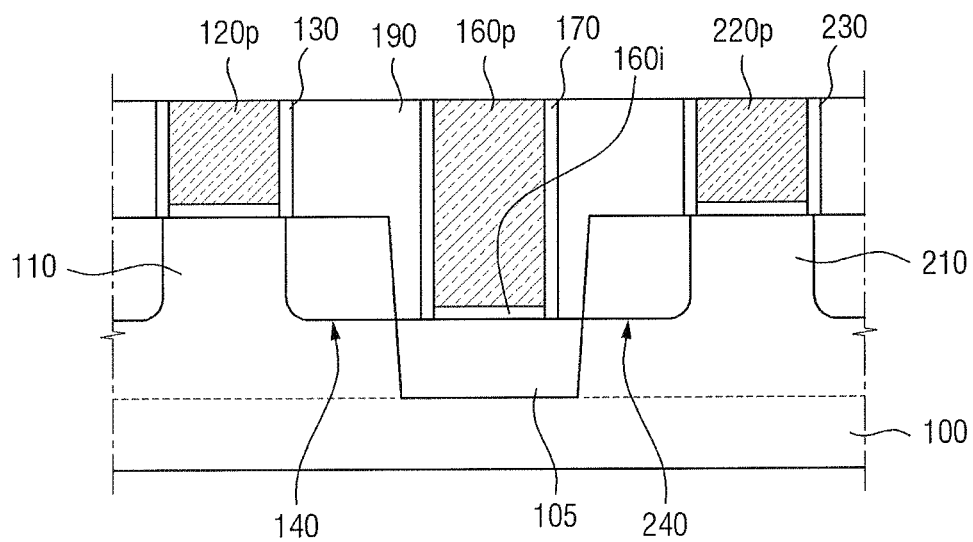

Referring to FIG. 25, a first source/drain 140 may be formed on both sides of the first dummy gate electrode 120p, within the first fin-type pattern 110.

A second source/drain 240 may be formed on both sides of the second dummy gate electrode 220p, within the second fin-type pattern 210.

As described above with reference to FIG. 6, the first source/drain 140 and the second source/drain 240 may each include an epitaxial layer.

An interlayer insulating film 190 may then be formed on the field insulating film 105, covering the first fin-type pattern 110 and the second fin-type pattern 210, and the first to third dummy gate electrodes 120p, 220p, and 160p.

The interlayer insulating film 190 may be planarized until the upper surfaces of the first to third dummy gate electrodes 120p, 220p, and 160p are exposed. As a result, the first mask pattern 2001 may be removed.

Figure 26:
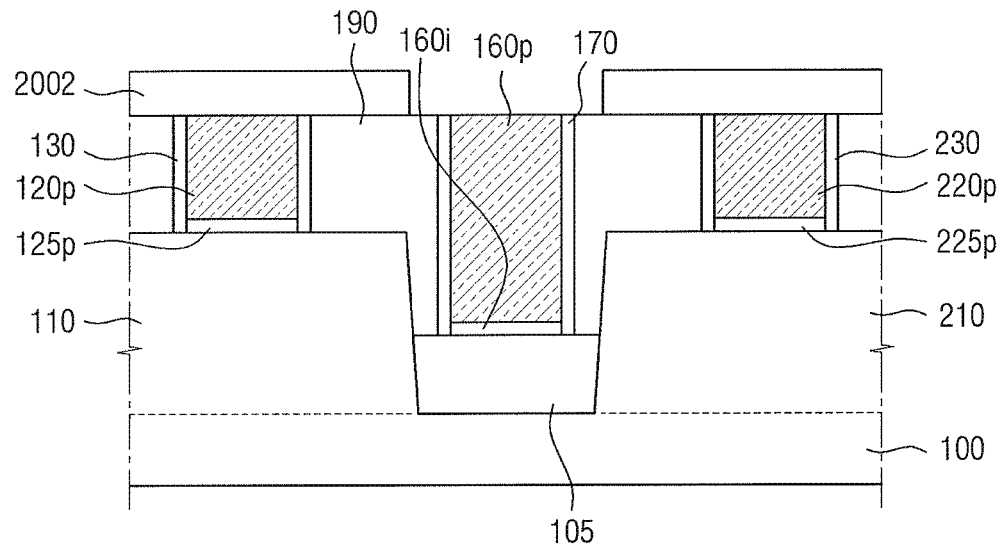

Referring to FIG. 26, a second mask pattern 2002 may be formed, covering the upper surface of the first dummy gate electrode 120p and the upper surface of the second dummy gate electrode 220p, while exposing the upper surface of the third dummy gate electrode 160p.

The second mask pattern 2002 may include an opening that exposes the upper surface of the third dummy gate electrode 160p.

In an implementation, the upper surface of the third dummy gate electrode 160p and the upper surface of the first liner 170 may be exposed by the opening included in the second mask pattern 2002.

Figure 27:
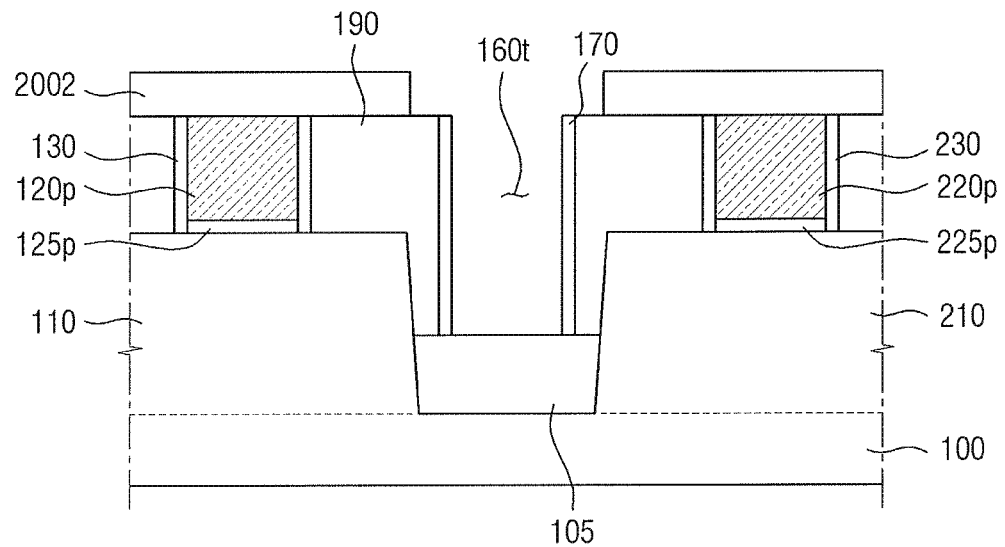

Referring to FIG. 27, the third dummy gate electrode 160p may be removed, using the second mask pattern 2002. In an implementation, the third dummy gate insulating film 160i may also be removed.

The third trench 160t may be formed in the interlayer insulating film 190 by removing the third dummy gate electrode 160p.

The upper surface of the field insulating film 105 may be exposed by removing the third dummy gate electrode 160p.

In an implementation, unlike the illustration in FIG. 27, in a process of removing the third dummy gate electrode 160p and the third dummy gate insulating film 160i, the interlayer insulating film 190 and/or a portion of the first liner 170 that are not covered by the second mask pattern 2002 may be recessed.

Figure 28:
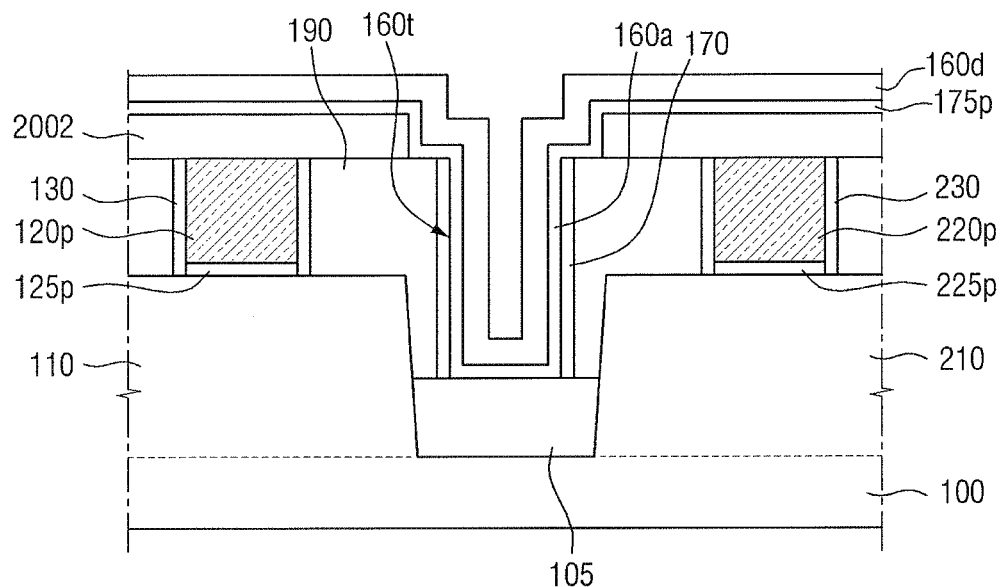

Referring to FIG. 28, a liner film 175p may be formed along the sidewall and the bottom surface of the third trench 160t, and along the upper surface of the second mask pattern 2002.

Next, on the liner film 175p, the insulating line film 160d may be formed along a profile of the liner film 175p.

The liner film 175p may include a material having an etch selectivity to a material included in the first liner 170.

In an implementation, the insulating line film 160d may include a material having an etch selectivity to a material included in the liner film 175p.

In an implementation, as illustrated in FIG. 28, the liner film 175p may be a single layer.

Figure 29:
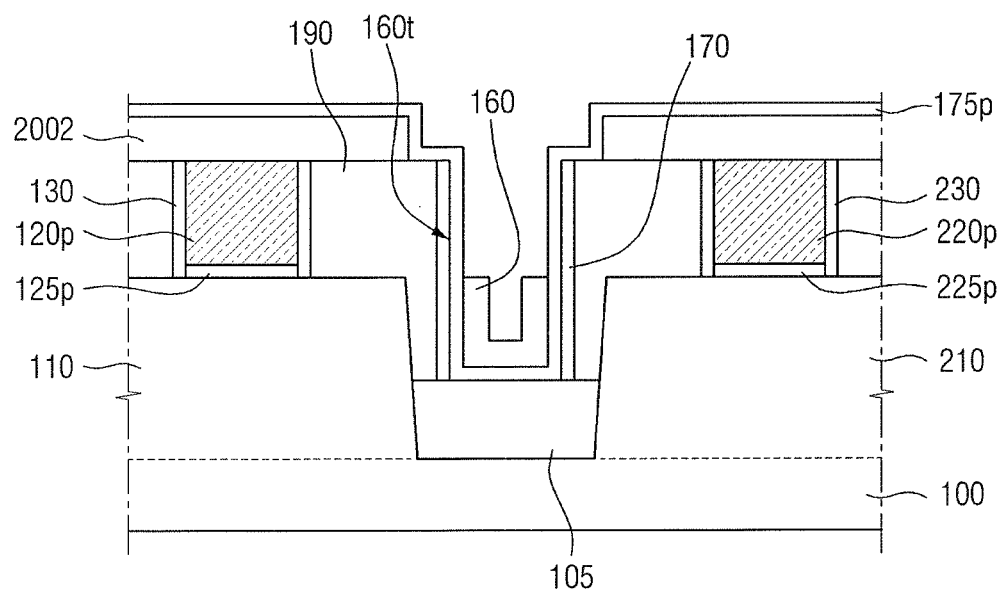

Referring to FIG. 29, an insulating line pattern 160 may be formed, extending along a portion of the sidewall and the bottom surface of the third trench 160t.

The insulating line pattern 160 may be formed by removing a portion of the insulating line film 160d formed on the sidewall of the third trench 160t. In the process of removing the insulating line pattern 160, the insulating line film 160d formed on the upper surface of the second mask pattern 2002 may be removed.

There may be an etch selectivity between the insulating line film 160d and the liner film 175p, and a liner film 175p at a location where the insulating line film 160d has been removed, may remain.

In an implementation, unlike the illustration, during formation of the insulating line pattern 160, the insulating line film 160d formed on the bottom surface of the third trench 160t may also be removed.

Figure 30:
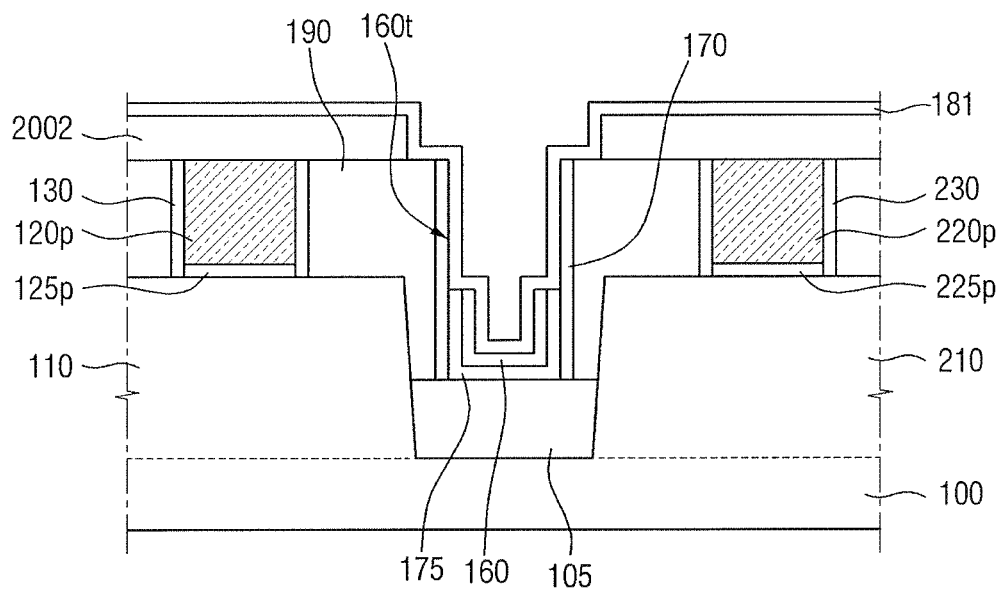

Referring to FIG. 30, the liner film 175p exposed by the removal of the insulating line film 160d may be removed to form a second liner 175.

The second liner 175 may be formed, extending along a portion of the sidewall and the bottom surface of the third trench 160t.

A sacrificial liner film 181 may then be formed on the insulating line pattern 160. The sacrificial liner film 181 may be formed along the upper surface of the second mask pattern 2002, along the sidewall of the first liner 170, and along the insulating line pattern 160.

In an implementation, the sacrificial liner film 181 may include, e.g., polysilicon or the like.

Figure 31:
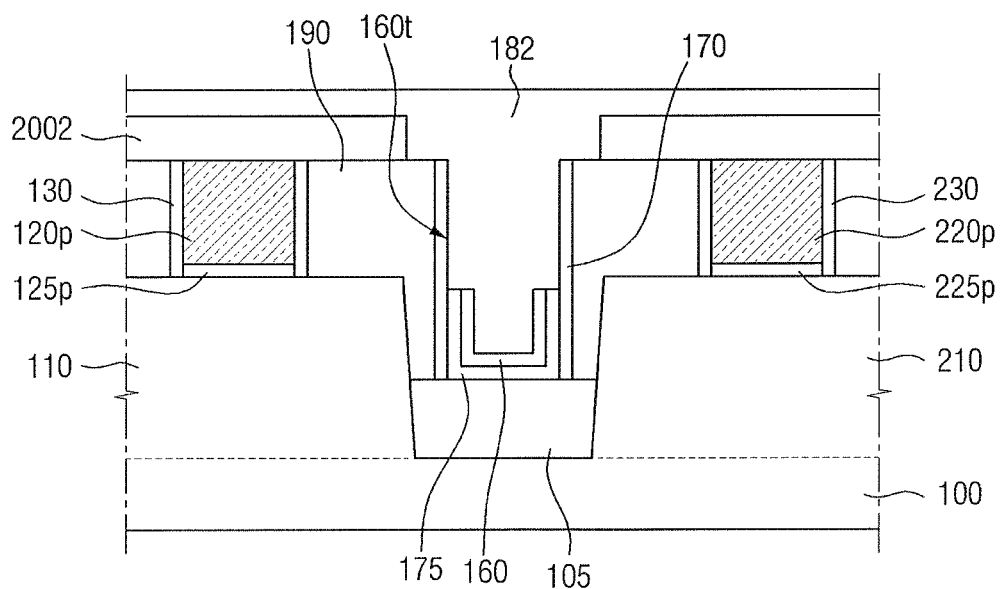

Referring FIG. 31, a sacrificial film 182 filling the third trench 160t may be formed on the sacrificial film 181.

The sacrificial film 182 may fill the third trench 160t, while covering the upper surface of the second mask pattern 2002. The sacrificial film 182 may include a sacrificial liner film 181.

In an implementation, the sacrificial film 182 may include, e.g., silicon, silicon germanium, germanium, silicon oxide, silicon nitride, silicon oxynitride, flowable oxide (FOX), Tonen Silazene (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, spin on glass (SOG), spin on hardmask (SOH), or a combination thereof.

Figure 32:
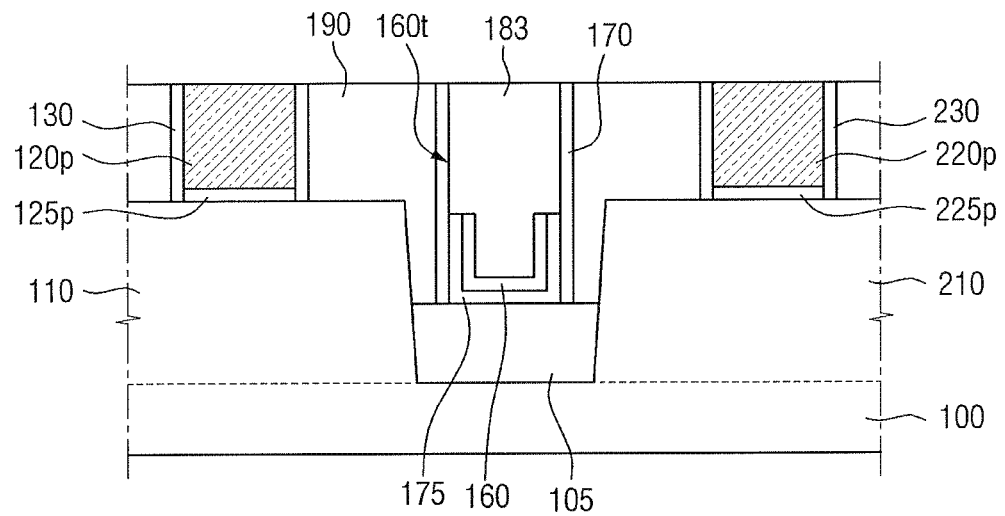

Referring FIG. 32, due to a removal of a portion of the sacrificial film 182, a sacrificial film 183 filling the third trench 160t may be formed.

By removing the sacrificial film 182 formed on the upper surface of the second mask pattern 2002, a sacrificial pattern 183 may be formed.

During formation of the sacrificial pattern 183, the second mask pattern 2002 may also be removed. As a result, the first dummy gate electrode 120p and the second dummy gate electrode 220p may be exposed.

Figure 33:
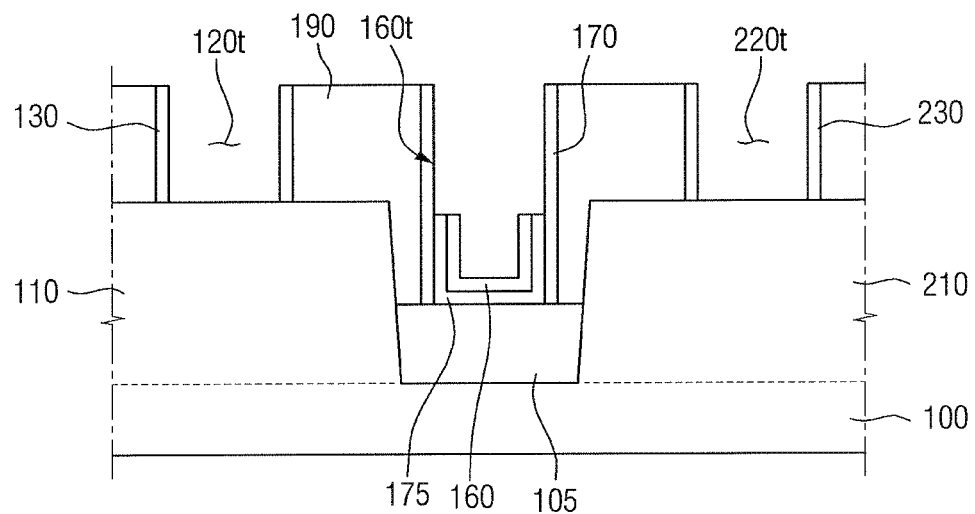

Referring to FIG. 33, the sacrificial pattern 183, the first dummy gate electrode 120p, and the second dummy gate electrode 220p may be removed.

In an implementation, the first dummy gate insulating film 125p and the second dummy gate insulating film 225p may be removed.

By removing the first dummy gate electrode 120p and the first dummy gate insulating film 125p, a first trench 120t exposing a portion of the first fin-type pattern 110 and being defined by the first spacer 130 may be formed.

By removing the second dummy gate electrode 220p and the second dummy gate insulating film 225p, a second trench 220t exposing a portion of the second fin-type pattern 210 and being defined by the second spacer 230 may be formed.

Referring to FIG. 4, the first gate electrode 120 for filling the first trench 120t may be formed on the first fin-type pattern 110, and the second gate electrode 220 for filling the second trench 220t may be formed on the second fin-type pattern 210.

In an implementation, the conductive pattern 180 for filling a portion of the third trench 160t, e.g., for filling the upper portion 160ut of the third trench, may be formed on the insulating line pattern 160 and the second liner 175.

Hereinbelow, a method for fabricating a semiconductor device according to some exemplary embodiments will be described with reference to FIGS. 4, 21 to 29, and 32 to 34.

Figure 34:
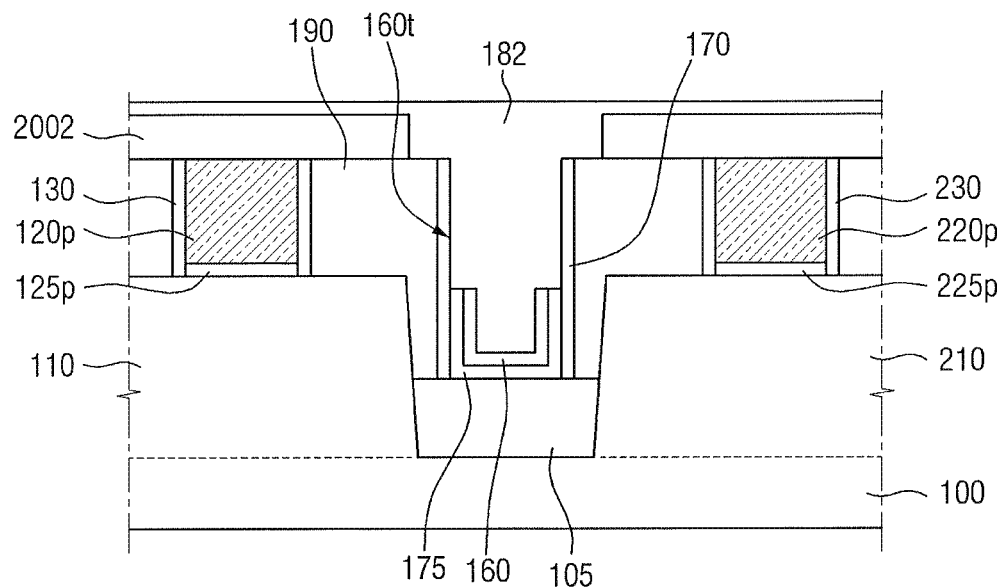
FIG. 34 illustrates a sectional view of a stage of a method of fabrication of a semiconductor device according to some exemplary embodiments.

FIG. 34 illustrates a sectional view of a stage in a method of fabricating a semiconductor device according to some exemplary embodiments. For reference, FIG. 34 may involve a process performed after FIG. 29.

Referring to FIG. 34, a sacrificial film 182 filling the third trench 160t while covering the upper surface of the second mask pattern 2002 may be formed.

In the fabrication method of the semiconductor device according to some exemplary embodiments, before forming the sacrificial film 182, the sacrificial liner film 181 may not be formed along the upper surface of the second mask pattern 2002, along the sidewall of the first liner 170, and along the insulating line pattern 160.

Hereinbelow, a method for fabricating a semiconductor device according to some exemplary embodiments will be described with reference to FIGS. 4, 21 to 27, 35, and 36.

Figure 35:
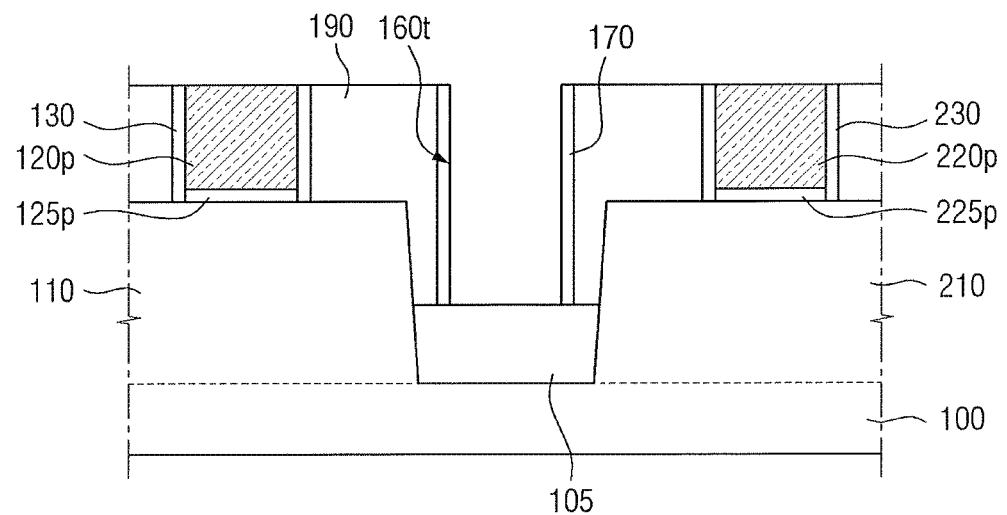
FIGS. 35 and 36 illustrate sectional views of stages in an method of fabrication of a semiconductor device according to some exemplary embodiments.
Figure 36:
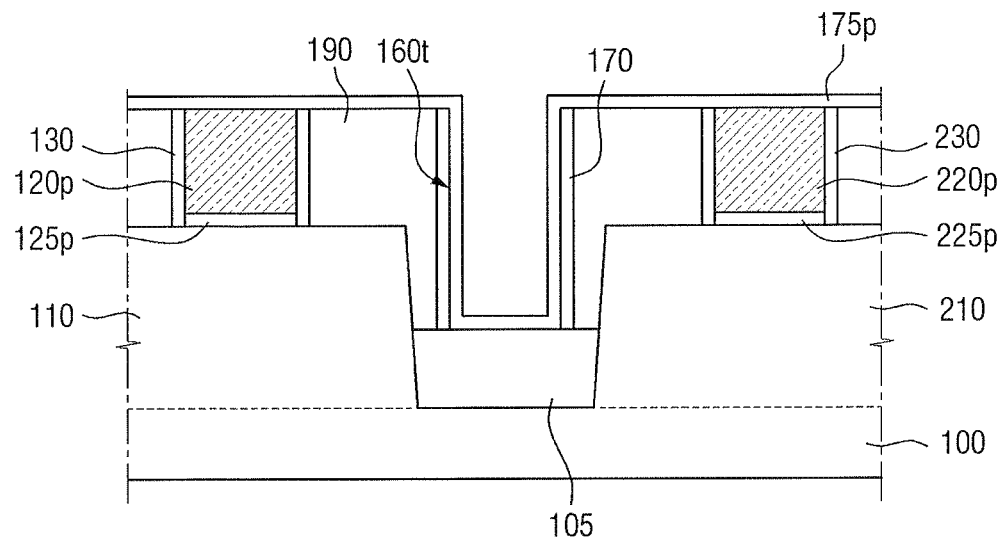

FIGS. 35 and 36 illustrate sectional views of stages in a method for fabricating a semiconductor device according to some exemplary embodiments. For reference, FIG. 35 may involve a process performed after FIG. 27.

Referring to FIG. 35, the second mask pattern 2002 on the interlayer insulating film 190 may be removed.

As a result, the upper surface of the interlayer insulating film 190, the first dummy gate electrode 120p, and the second dummy gate electrode 220p may be exposed.

Referring to FIG. 36, a liner film 175p may be formed, extending along the sidewall and the bottom surface of the third trench 160t, and along the upper surface of the interlayer insulating film 190.

Next, although not illustrated, on the liner film 175p, the insulating line film 160d may be formed along a profile of the liner film 175p.

Figure 37:
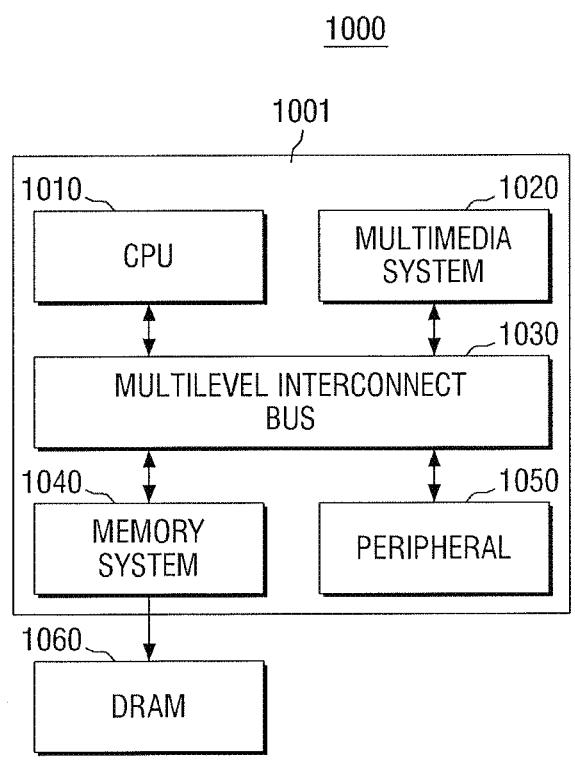
FIG. 37 illustrates a block diagram of a system-on-chip (SoC) system including a semiconductor device according to exemplary embodiments.

FIG. 37 illustrates a block diagram of a system on chip (SoC) including a semiconductor device according to exemplary embodiments.

Referring to FIG. 37, a SoC system 1000 includes an application processor 1001 and a dynamic random-access memory (DRAM) 1060.

The application processor 1001 may include a central processing unit (CPU) 1010, a multimedia system 1020, a bus 1030, a memory system 1040 and a peripheral circuit 1050.

The CPU 1010 may perform arithmetic operation necessary for driving of the SoC system 1000. In some exemplary embodiments, the CPU 1010 may be configured on a multi-core environment which includes a plurality of cores.

The multimedia system 1020 may be used for performing a variety of multimedia functions on the SoC system 1000. The multimedia system 1020 may include a 3D engine module, a video codec, a display system, a camera system, a post-processor, or the like.

The bus 1030 may be used for exchanging data communication among the CPU 1010, the multimedia system 1020, the memory system 1040 and the peripheral circuit 1050. In some exemplary embodiments, the bus 1030 may have a multi-layer structure. Specifically, an example of the bus 1030 may be a multi-layer advanced high-performance bus (AHB), or a multi-layer advanced eXtensible interface (AXI), although exemplary embodiments are not limited herein.

The memory system 1040 may provide environments necessary for the application processor 1001 to connect to an external memory (e.g., DRAM 1060) and perform high-speed operation. In some exemplary embodiments of the present disclosure, the memory system 1040 may include a separate controller (e.g., DRAM controller) to control an external memory (e.g., DRAM 1060).

The peripheral circuit 1050 may provide environments necessary for the SoC system 1000 to have a seamless connection to an external device (e.g., main board). Accordingly, the peripheral circuit 1050 may include a variety of interfaces to allow compatible operation with the external device connected to the SoC system 1000.

The DRAM 1060 may function as an operation memory necessary for the operation of the application processor 1001. In some exemplary embodiments, the DRAM 1060 may be disposed externally to the application processor 1001, as illustrated. Specifically, the DRAM 1060 may be packaged into a package on package (PoP) type with the application processor 1001.

At least one of the above-mentioned components of the SoC system 1000 may include at least one of the semiconductor devices according to the exemplary embodiments explained above.

The embodiments may provide a semiconductor device capable of improving reliability by enhancing device isolation characteristics, and also improving device performance by enhancing a design suitability.

The embodiments may provide a method for fabricating a semiconductor device capable of improving reliability by enhancing device isolation characteristics, and also improving device performance by enhancing a design suitability.

Example embodiments have been disclosed herein; and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a first fin pattern and a second fin pattern, which are in parallel in a lengthwise direction;
   a first trench between the first fin pattern and the second fin pattern;
   a field insulating film partially filling the first trench, an upper surface of the field insulating film being lower than an upper surface of the first fin pattern and an upper surface of the second fin pattern;
   a spacer spaced apart from the first fin pattern and the second fin pattern, the spacer being on the field insulating film and defining a second trench, the second trench including an upper portion and a lower portion;
   an insulating line pattern on a sidewall of the lower portion of the second trench; and
   a conductive pattern filling an upper portion of the second trench and being on the insulating line pattern.

2. The semiconductor device as claimed in claim 1, wherein the insulating line pattern extends along the sidewall of the lower portion of the second trench and a bottom surface of the lower portion of the second trench.

3. The semiconductor device as claimed in claim 1, wherein the insulating line pattern is not formed on a bottom surface of the second trench.

4. The semiconductor device as claimed in claim 1, wherein the insulating line pattern is not extended along a sidewall of the upper portion of the second trench.

5. The semiconductor device as claimed in claim 1, further comprising a liner extending along a sidewall of the second trench between the insulating line pattern and the spacer.

6. The semiconductor device as claimed in claim 5, wherein the liner extends along a portion of the sidewall of the second trench.

7. The semiconductor device as claimed in claim 1, wherein a portion of the conductive pattern extends between the insulating line pattern.

8. The semiconductor device as claimed in claim 1, further comprising a high-k dielectric insulating film extending along the spacer and the insulating line pattern, wherein the conductive pattern is on the high-k dielectric insulating film.

9. The semiconductor device as claimed in claim 8, further comprising an air gap between the high-k dielectric insulating film and the conductive pattern.

10. The semiconductor device as claimed in claim 1, further comprising a first gate electrode on the first fin pattern, and a second gate electrode on the second fin pattern, wherein an upper surface of the first gate electrode, an upper surface of the second gate electrode, and an upper surface of the conductive pattern are located in a same plane.

11. A semiconductor device, comprising:
    a first fin pattern having a long side and a short side;
    a field insulating film on a sidewall of the first fin pattern, an upper surface of the field insulating film being lower than an upper surface of the first fin pattern;
    a spacer on the field insulating film, the spacer being spaced apart from the first fin pattern and defining a trench;
    an insulating line pattern extending along a portion of a sidewall of the trench, on the spacer, an uppermost portion of the insulating line pattern being equal to or higher than the upper surface of the first fin pattern; and a conductive pattern filling the trench on the insulating line pattern.

12. The semiconductor device as claimed in claim 11, wherein the insulating line pattern includes a portion extending along a bottom surface of the trench.

13. The semiconductor device as claimed in claim 11, further comprising a high-k dielectric insulating film extending along the spacer and the insulating line pattern, wherein:
the high-k dielectric insulating film covers an uppermost surface of the insulating line pattern, and
the conductive pattern is on the high-k dielectric insulating film.

14. The semiconductor device as claimed in claim 11, further comprising a source/drain region on the first fin pattern, wherein the source/drain region is not in contact with the spacer.

15. The semiconductor device as claimed in claim 11, wherein:
the trench includes a first sidewall and a second sidewall facing each other, and
the insulating line pattern on the first sidewall of the trench and the insulating line pattern on the second sidewall of the trench are spaced apart from each other.

16. A semiconductor device, comprising:
a laterally adjacent first fin pattern and second fin pattern on a substrate;
a first trench between the laterally adjacent first fin pattern and second fin pattern;
a field insulating film partially filling the first trench such that field insulating film is on a sidewall of the first fin pattern and a sidewall of the second fin pattern, a distance between an upper surface of the field insulating film and the substrate being smaller than a distance between an upper surface of the first fin pattern and the substrate and a distance between an upper surface of the second fin pattern and the substrate;
a spacer completely spaced apart from the first fin pattern and the second fin pattern, the spacer being on the field insulating film and defining a second trench such that the second trench includes an upper portion and a lower portion;
an insulating line pattern on a sidewall of the lower portion of the second trench; and
a conductive pattern filling the upper portion of the second trench and being on the insulating line pattern.

17. The semiconductor device as claimed in claim 16, wherein a distance between the substrate and an uppermost portion of the insulating line pattern is equal to or greater than the distance between the upper surface of the first fin pattern and the substrate and equal to or greater than the distance between the upper surface of the second fin pattern and the substrate.

18. The semiconductor device as claimed in claim 16, wherein the insulating line pattern extends along a bottom surface of the lower portion of the second trench.

19. The semiconductor device as claimed in claim 16, wherein a distance from an uppermost surface of the insulating line pattern and the substrate is less than a distance between the substrate and a lowermost portion of a sidewall of the upper portion of the second trench.

20. The semiconductor device as claimed in claim 16, further comprising a liner extending along a sidewall of the second trench between the insulating line pattern and the spacer.

* * * * *